US008943352B1

(12) United States Patent
Warneke

(10) Patent No.: US 8,943,352 B1
(45) Date of Patent: Jan. 27, 2015

(54) LOW POWER TIMING, CONFIGURING, AND SCHEDULING

(75) Inventor: Brett Warneke, Milpitas, CA (US)

(73) Assignee: Dust Networks, Inc., Hayward, CA (US)

( * ) Notice: Subject to any disclaimer, the term of this patent is extended or adjusted under 35 U.S.C. 154(b) by 234 days.

(21) Appl. No.: 13/465,722

(22) Filed: May 7, 2012

(51) Int. Cl.
*G06F 1/00* (2006.01)
*G06F 1/04* (2006.01)
*H03B 19/00* (2006.01)
*H03K 3/03* (2006.01)
*G06F 1/32* (2006.01)

(52) U.S. Cl.
CPC ............ *G06F 1/3237* (2013.01); *G06F 1/3234* (2013.01)
USPC .............. 713/500; 713/600; 327/113; 331/46

(58) Field of Classification Search
USPC ........................................................ 713/500
See application file for complete search history.

(56) References Cited

U.S. PATENT DOCUMENTS

| | | | | | |
|---|---|---|---|---|---|
| 5,226,012 | A | * | 7/1993 | Amano et al. | 365/189.05 |
| 5,767,747 | A | * | 6/1998 | Pricer | 331/46 |
| 6,233,296 | B1 | * | 5/2001 | Hofman | 375/375 |
| 7,671,876 | B2 | * | 3/2010 | Noh | 345/698 |
| 8,183,937 | B2 | * | 5/2012 | McDonald et al. | 331/18 |
| 8,466,751 | B2 | * | 6/2013 | Simondin | 331/44 |
| 2004/0162046 | A1 | * | 8/2004 | Yamauchi et al. | 455/260 |
| 2005/0221870 | A1 | * | 10/2005 | Erdelyi et al. | 455/574 |
| 2006/0242446 | A1 | * | 10/2006 | Hanamori | 713/500 |
| 2008/0077820 | A1 | * | 3/2008 | Jensen et al. | 713/500 |
| 2009/0132742 | A1 | * | 5/2009 | Simmons et al. | 710/106 |

OTHER PUBLICATIONS

Peter Greenhalgh, "Big.LITTLE Processing with ARM Cortex™-A15 & Cortex-A7: Improving Energy Efficiency in High-Performance Mobile Platforms," White Paper: ARM, Sep. 2011, pp. 1-8.
"Windows Timer Coalescing," Windows, Jan. 20, 2009.

* cited by examiner

*Primary Examiner* — Stefan Stoynov
(74) *Attorney, Agent, or Firm* — McDermott Will & Emery LLP

(57) ABSTRACT

A device reduces its energy consumption using a relatively lower frequency and lower power secondary oscillator to maintain timing information when a higher frequency and higher power primary oscillator is inactivated. The secondary oscillator maintains timing information at a higher resolution than the period of the oscillator, so as to conserve synchronization when the higher frequency, higher power primary oscillator is inactivated. In some embodiments, a microsequencer is programmably configured to control an integrated radio receiver and transmitter using less power than an associated microprocessor would use to perform the same functions. In other embodiments, flexible event timing facilitates the merging of wake-up events to reduce the energy consumed by wake-up operations in the device.

16 Claims, 15 Drawing Sheets

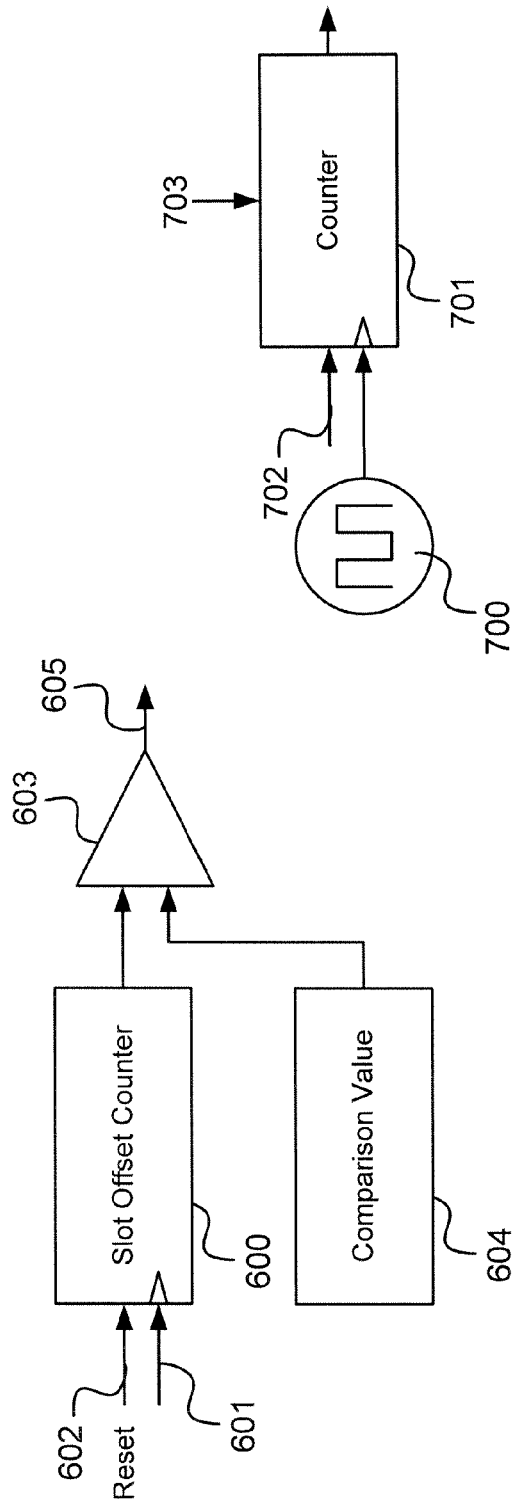
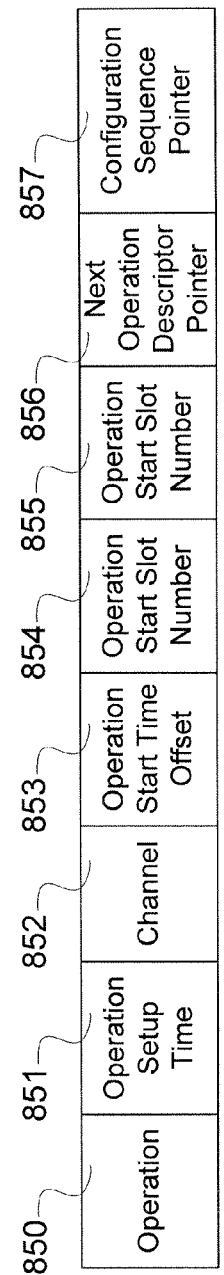
FIG. 6
FIG. 7
FIG. 8D

LOW POWER TIMING, CONFIGURING, AND SCHEDULING

BACKGROUND OF THE INVENTION

Conventional real-time embedded systems utilize one or more timers to tell the system when certain tasks need to be performed. To minimize the time that high current components are turned on, it can be beneficial to maintain a sense of time to a higher precision. However, the conventional way to do this is using higher frequency oscillators and timers, but this increases the power consumption. A need therefore exists for methods and systems for providing high precision clocking in an embedded system without using a high frequency oscillator or timer.

One of the major power consumers in an embedded system is the microprocessor, so to minimize the power consumption the system should minimize the use of this microprocessor while still providing the desired functionality and level of programmability. A need therefore exists for methods and systems for reducing or minimizing the use of a microprocessor in an embedded system while maintaining functionality of the system.

For power- or energy-constrained embedded systems, a key technique for minimizing power and energy consumption is to maximize the amount of time that high current components of the system are turned off. Likewise, turning components on or moving the system from one power level to another often consumes additional energy due to node capacitances being charged or oscillators needing time to stabilize, so minimizing the number of times that such transitions are made is also important for keeping the average power and energy consumption low. A need therefore exists for methods and systems for reducing or minimizing the number of times that components of low-power embedded systems are turned on or that the power level of such systems are moved.

BRIEF DESCRIPTION OF THE DRAWINGS

Various embodiments of the invention are disclosed in the following detailed description and the accompanying drawings.

FIG. 6 is a block diagram illustrating an embodiment of a device that subdivides slot and can generate events within a slot.

FIG. 7 is a block diagram illustrating an embodiment of a device that further subdivides a slot for increased resolution.

FIG. 8D is a block diagram illustrating an operation descriptor having a plurality of exemplary fields for controlling a finite state machine.

DETAILED DESCRIPTION

Figure 1:
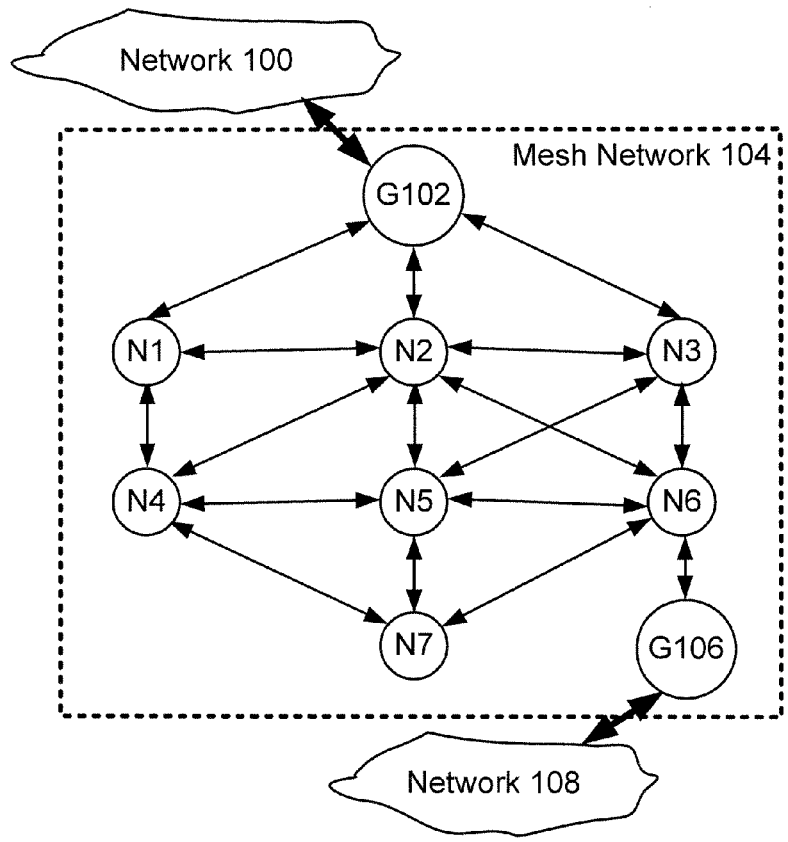
FIG. 1 is a block diagram illustrating an embodiment of a mesh network.

The invention can be implemented in numerous ways, including as a process, an apparatus, a system, a composition of matter, a computer readable medium such as a computer readable storage medium or a computer network wherein program instructions are sent over optical or communication links. In this specification, these implementations, or any other form that the invention may take, may be referred to as techniques. A component such as a processor or a memory described as being configured to perform a task includes both a general component that is temporarily configured to perform the task at a given time or a specific component that is manufactured to perform the task. In general, the order of the steps of disclosed processes may be altered within the scope of the invention. As used herein, the term 'processor' refers to one or more devices, circuits, and/or processing cores configured to process data, such as computer program instructions.

A detailed description of one or more embodiments of the invention is provided below along with accompanying figures that illustrate the principles of the invention. The invention is described in connection with such embodiments, but the invention is not limited to any embodiment. The scope of the invention is limited only by the claims and the invention encompasses numerous alternatives, modifications and equivalents. Numerous specific details are set forth in the following description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

A device to reduce energy consumption when performing programmable event-based tasks is disclosed. In some embodiments, timing information can be maintained at a resolution higher than the period of the oscillator that is providing the base time reference. In general, the lower the frequency of the oscillator, the less power the oscillator and associated load circuitry will consume. However, by using a low power oscillator having a lower frequency in combination with timing information having a higher resolution than the oscillator period, device power consumption can be reduced without compromising on timing resolution. The device can also provide a convenient mechanism for maintaining time in terms of timeslots, which is useful in a system that uses Time Division Multiple Access (TDMA), simplifies the software used to manage the TDMA, and reduces power consumption and memory storage requirements. For example, memory storage requirements may be reduced by implementing slot management functionality in hardware, thereby reducing the size of (and associated storage requirements for) software and data memory used in maintaining slot timing, converting times between device and slot times, and performing time-compensation functions.

As used herein a clock, signal, value, or information having a higher resolution than an other corresponds to a clock, signal, value, or information having a more precise value than the other. For example, a clock having a higher frequency (and shorter period) than an other clock has a higher resolution than the other as it provides more precise timing. A value having a higher resolution than an other may be maintained to a higher decimal accuracy than the other.

In some embodiments, device power consumption is further reduced through the use of a microsequencer which has a lower power consumption than the microprocessor of a device (e.g., an integrated radio transceiver), but can nonetheless perform some of the functions usually performed by the microprocessor. The microsequencer thus executes configuration and enabling steps for the transceiver in a programmable way, without consuming the larger power consumption of the full microprocessor. In some examples, the microsequencer is triggered by a high resolution timing system to allow events to be performed at precise times.

In further embodiments, wake-up events during which device components are activated and taken out of a low-power (e.g., an inactive, sleep, or standby) state are combined, such that multiple wake-up events occur concurrently (at the same time) rather than at different times. The method thus reduces the number of times the device needs to wake up. Often, waking a system up consumes extra energy that does not provide work that is useful to the goals of the system. For example, regulators and DC-DC converters take some time to reach the desired operating point during which time they are consuming power but not producing work, certain components may have their power turned on or the power supply voltages increased, which causes energy to be consumed charging up various nodes in the circuit, or an oscillator may need to be turned on, causing energy to be wasted until the oscillations have stabilized. One way to reduce the impact of these energy costs is to reduce the number of times the system wakes up. In many systems there are certain activities, such as feeding a watchdog or sampling a low frequency sensor, that don't need to occur at specific times, but instead need to occur at approximate times. In some embodiments "soft" timers that provide a window over which something such as servicing a microprocessor interrupt or sampling a temperature sensor can happen if the device happens to wake up for some other reason, such as a universal asynchronous receiver/transmitter (UART) packet arriving. If at the end of the window no opportunistic wake-up event has occurred, a wake-up is forced so that a worst case wake-up time is defined. In some embodiments, this device may be a node in a wireless mesh network.

FIG. 1 is a block diagram illustrating an embodiment of a mesh network. In the example shown, mesh network 104 can communicate with network 100 and/or network 108. Network 100 and network 108 comprise communication networks. In various embodiments, network 100 and/or network 108 comprise(s) a local area network (LAN), a wide area network (WAN), the Internet, a wired network, a wireless network, or any other appropriate communication network. Mesh network 104 includes gateway nodes and mesh network nodes. Gateway nodes are represented in FIG. 1 as G102 and G106. The gateway nodes are able to communicate directly with a network—for example, networks 100 and 108, respectively—and with mesh network nodes. For example, G102 is able to directly communicate with N1, N2, and N3. In some embodiments, the gateway node acts as a mesh network coordinator sending to and receiving from the mesh network nodes information, configuration, status updates, etc. In some embodiments, there are multiple gateway nodes that can communicate with the same network (e.g., network 100) or one or more different networks. Mesh network nodes are represented in FIG. 1 as N1-N7. A mesh network node can communicate with other mesh network nodes and gateway nodes. In some embodiments, mesh network nodes are sensor or device mesh network nodes. For example, mesh network node N6 is able to communicate directly with mesh network node N3 and with gateway node G106. In various embodiments, the connections allow communication only in one direction (i.e., to a node or from a node) or in both directions (i.e., both to and from a node).

In the example shown in FIG. 1, gateway and mesh network nodes communicate via radio transmitters and receivers using a packet. In various embodiments, a packet includes a header section and a data section. In various embodiments, the packet header includes information regarding packet type, time sent, source node, destination node, associated frame, node health, number of tries for a hop, number of hops, etc. The packets are sent during defined time slots on defined frequencies using a time division multiple access (TDMA) methodology.

Figure 2A:
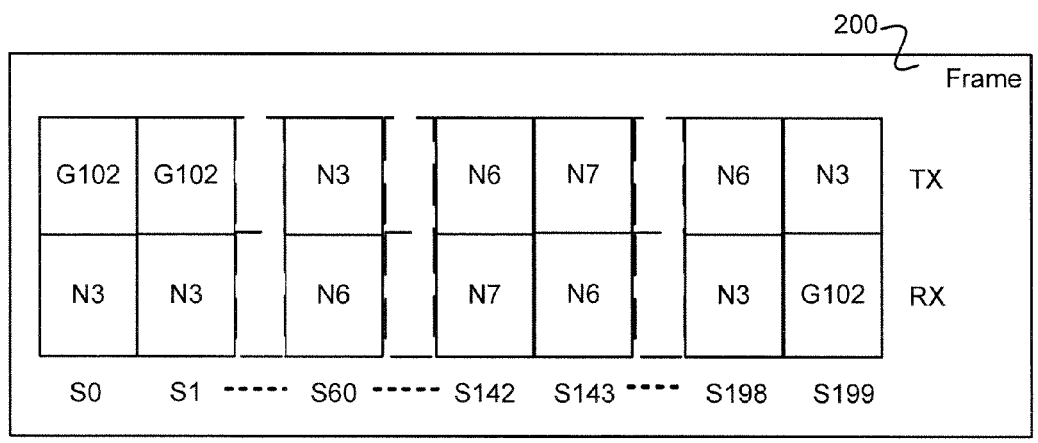
FIG. 2A is a block diagram illustrating an embodiment of a frame.

FIG. 2A is a block diagram illustrating an embodiment of a frame. In the example shown, frame 200 includes time slots (e.g., S0, S1, . . . ) that designate a receiver (RX) and a transmitter (TX). During each time slot, a designated transmitter node can transmit one or more packets to a designated receiver node of the mesh network. In various embodiments, the frequency used for transmission and reception is fixed, is selected from a pool of frequencies, rotates in a fixed manner, is randomly assigned, or any other appropriate manner of assigning frequency to a transmission and reception. In various embodiments, the frequency comprises a frequency in the industrial, scientific, and medical (ISM) radio band from 902 MHz to 928 MHz, or the ISM band from 2.4 GHz to 2.4835 GHz. Frame 200 is repeated periodically, for example after executing the transmissions/receptions for all of its time slots. The network can support several different frames either running at different times or running concurrently. Some frames have only a few slots, while other frames have many slots, depending on their design. Frame 200 contains 200 time slots (represented by S0, S1, S60, 5142, 5143, S198, and S199). Transmission links in the mesh network are assigned cells in a frame during which then can communicate. The transmissions and receptions for the frame are represented by designating a transmitter and a receiver for a given time slot. In time slots S0 and S1, for example, gateway G102 is permitted to send one or more packets to node N3. In time slot S60, node N3 can send packets to node N6. In time slot S142, node N6 can send packets to node N7. In time slot S143, node N7 can send packets to node N6. In time slot S198, node N6 can send packets to node N3. In time slot S199, node N3 can send packets to gateway G102. In some embodiments, the frame is developed by a gateway or managing node during setup or acquisition of nodes in the mesh network. In various embodiments, slots include one-to-one communication relationships wherein one transmitting node broadcasts one or more packets to a single receiving node; one-to-many communication relationships wherein one transmitting node broadcasts to a plurality of receiving nodes; many-to-one communication relationships wherein one of a selected set of transmitting nodes may transmit to a single receiving node; and many-to-many communication relationships wherein one of a selected set of transmitting nodes may transmit to a plurality of receiving nodes. The frame may be used by a node to determine one or more time slots during which the node should be awake in order to act as a transmitter or a receiver. For example, node N6 may determine from frame 200 that the node should be awake during slots S60 and S143 to act as a receiver in case nodes N3 or N7 transmit one or more packets for node N6 during the time slot. Node N6 may further determine that the node should be awake during slots S142 and S198 if the node has packets to transmit to nodes N7 or N3.

Figure 2B:
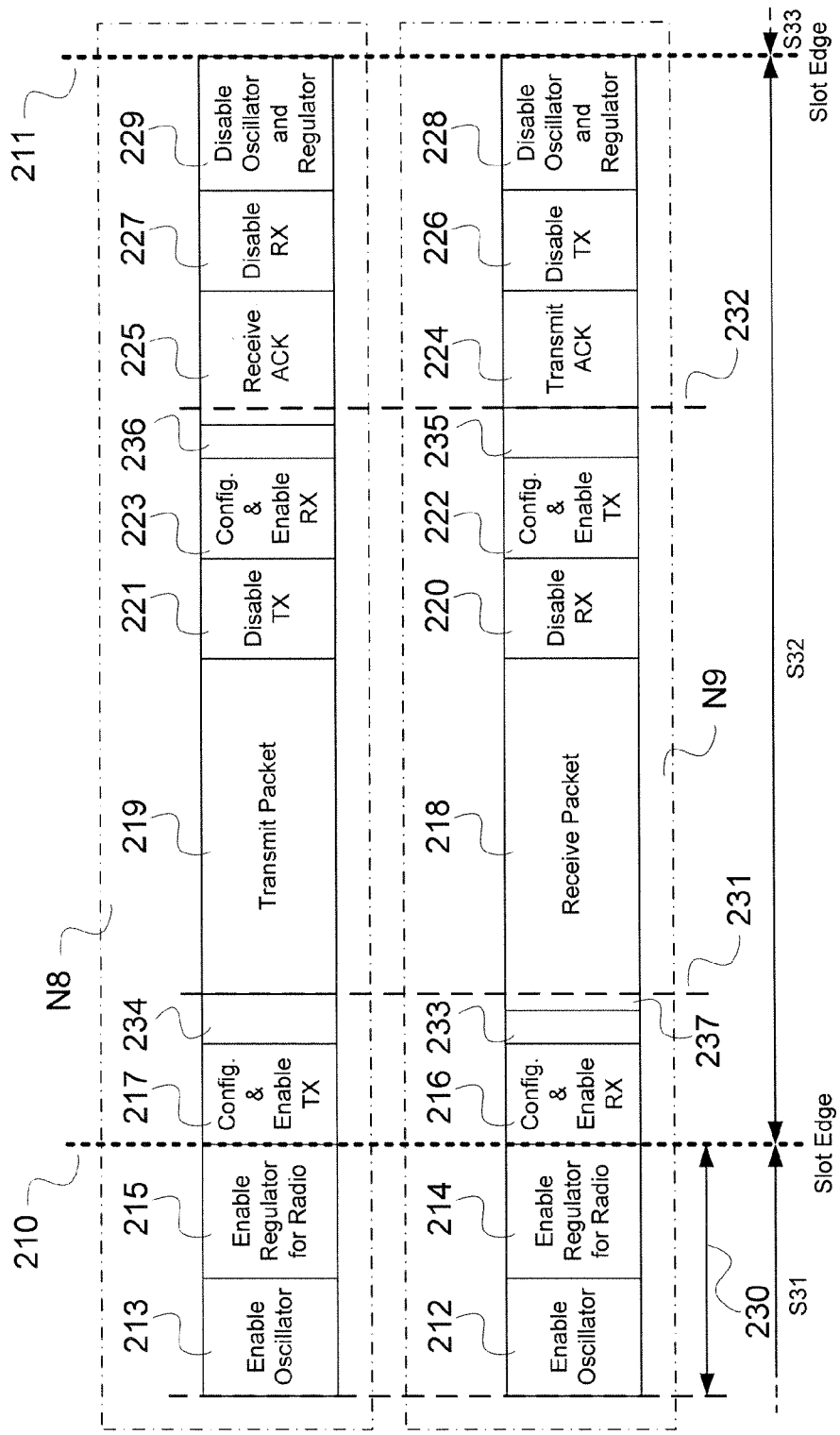
FIG. 2B is a timing diagram illustrating an embodiment of the radio transceiver activities within a time slot.

FIG. 2B is a block diagram illustrating an embodiment of the radio transceiver activities of a network node within a time slot S32 for an exemplary one-to-one communication between two nodes. During time slot S32, node N8 can transmit one or more packets to node N9. Thus, node N8 illustrates the exemplary timing of activities performed in a transmitting node during (and prior to commencement of) the time slot S32, and node N9 illustrates the exemplary timing of activities performed in a receiving node during (and prior to commencement of) the time slot S32. Time 210 is the slot edge separating slot S31 and S32, while time 211 is the slot edge separating slot S32 and S33. If the radio for N8 was not used in slot S31, then N8 begins preparing for the activity of slot S32 at a time 230 before slot edge 210 by first enabling the radio oscillator during period 213 and then enabling the power regulator for the radio during period 215. If the radio for N8 was used in slot S31, then the oscillator and regulator will already be enabled and ready for use in slot S32, such that node N8 need not prepare for the activity of slot S32 prior to time 210. Similarly, if the radio for N9 was not used in slot S31, then N9 begins preparing for the activity of slot S32 at a time 230 before slot edge 210 by first enabling the radio oscillator during period 212 then enabling the power regulator for the radio during period 214. Beginning at the slot edge (i.e., at time 210), N8 configures and enables its transmitter during period 217. This can take some time while components of the transmitter, such as the phase-locked loop (PLL), stabilize. Meanwhile, N9 configures and enables its receiver during period 216, which coincides or overlaps with period 217. Node N8 begins transmitting its packet at time 231 for a period 219. If nodes N8 and N9 were perfectly synchronized, N9 could also enable its receiver exactly at time 231, so as to minimize the power wasted by the receiver when no transmission is available to be received. However, since in a practical network nodes N8 and N9 are generally not perfectly synchronized, node N9 generally needs to be ready to receive packets for a time period 237 before the time at which the node N9 expects to begin receiving packets, such that even a worst case synchronization error between nodes N8 and N9 will result in node N9 being ready to receive packets at the beginning time 231 of period 219. If the sum of time periods 216 and 237 exceeds the time period 217, then node N8 may need to wait some period of time 234 after completing period 217 before beginning the transmission at time 231. Likewise, if the time period 217 exceeds the sum of time periods 216 and 237, then node N9 may need to wait some period of time 233 before fully enabling its receiver to be ready to begin receiving packets during periods 237 and 218. Time 231 should be expressed relative to time 210 so that time periods 234 and 233 can vary and deal with jitter in the time periods 217 and 216 and to provide flexibility during development. When the packet transmission of period 219 has completed, node N8 can disable its transmitter during period 221, prior to configuring and enabling its receiver during period 223 in preparation for receiving an acknowledgment (ACK) 225 from node N9. Meanwhile, node N9 can disable its receiver during period 220, prior to configuring and enabling its transmitter during period 222. At time 232, node N9 can begin transmitting its ACK during period 224. Node N8 will have enabled its receiver before time 232, so that the node is able to receive the ACK during a period 225. Similarly to the delay periods 233 and 234, the ACK process has delay periods 235 and 236 in the transmitting and receiving nodes N9 and N8, respectively, to ensure that node N8 is ready to receiving the ACK at time 232 even if nodes N8 and N9 are not precisely synchronized. Time 232 may again be expressed with respect to the start of the slot 210 or with respect to the end of the packet transmission of period 219. Once the ACK has been transmitted and received, node N9 will disable its transmitter during period 226 and node N8 will disable its receiver during period 227. If the next slot S33 is not used by nodes N8 and N9, the nodes may then disable the respective oscillators and regulators for their radios (during periods 228 and 229); otherwise, these steps can be skipped and the oscillators and regulators remain activated.

In order for a node (e.g., node N8) to be activated and transmit packets during a time slot (e.g., time slot S32), the node can therefore be activated for a total duration equal to the sum of period 230 and the duration of slot S32. Similarly, in order for a node (e.g., node N9) to be activated and receive packets during a time slot (e.g., time slot S32), the node can be activated for a total duration equal to the sum of period 230 and the duration of slot S32. The nodes can be in low-power (e.g., inactive, standby, or sleep) states prior to the beginning of period 230, and following the end of the period S32. In fact, in accordance with the timing diagram of FIG. 2B, while some components of the nodes are activated during all of periods 230 and S32, not all components need to be activated during the entire periods. For example, while the oscillators of the nodes may be activated for the entire periods 230 and S32 (i.e., from the beginning of periods 212 and 213, until the end of periods 228 and 229), regulators of the nodes may only be activated from the beginning of periods 214 and 215 until the end of periods 228 and 229; transmitters may only be activated from period 217 to period 221 or from period 222 to period 226; and receivers may only be activated from period 216 to period 220 or from period 223 to period 227. The power consumption of nodes in a mesh network may thus be reduced by selectively activating nodes, or components of nodes, for limited periods of time in a frame slot during which each component is needed (or may be needed) for operation.

Figure 3:
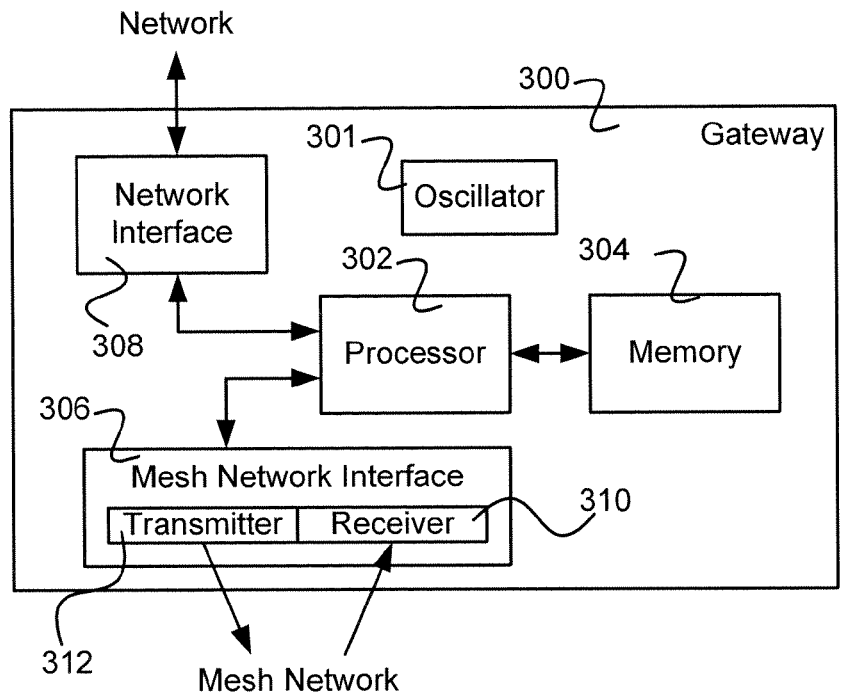
FIG. 3 is a block diagram illustrating an embodiment of a gateway of a mesh network.

FIG. 3 is a block diagram illustrating an embodiment of a gateway of a mesh network. In some embodiments, the gateway 300 of FIG. 3 is used to implement any of gateways G102 and/or G106 in FIG. 1. In the example shown, gateway 300 includes processor 302, memory 304, mesh network interface 306, and network interface 308. Processor 302 runs software that when executed manages the mesh network. Management of the mesh network can include network setup, adding nodes, removing nodes, adding frames to the network, removing frames, monitoring status, optimizing network performance by reconfiguring frames, time synchronization, and/or any other appropriate network management function. Memory 304 provides storage for processor 302 including run-time storage and instruction storage. Mesh network interface 306 includes receiver 310 and transmitter 312. Receiver 310 receives communications in the form of packets transmitted from nodes or gateways of the mesh network. Transmitter 312 transmits communications in the form of packets to nodes or gateways of the mesh network. Network interface 308 communicates with a communication network comprised of one or more devices. Information from the mesh network is passed directly to or processed by gateway 300 using processor 302 before passing to the communication network. In some embodiments, gateway 300 is line powered so that power limitations due to finite battery reserves are not an issue. In various embodiments, network management is accomplished by a remote application or is coordinated by a node in the network.

Figure 4:
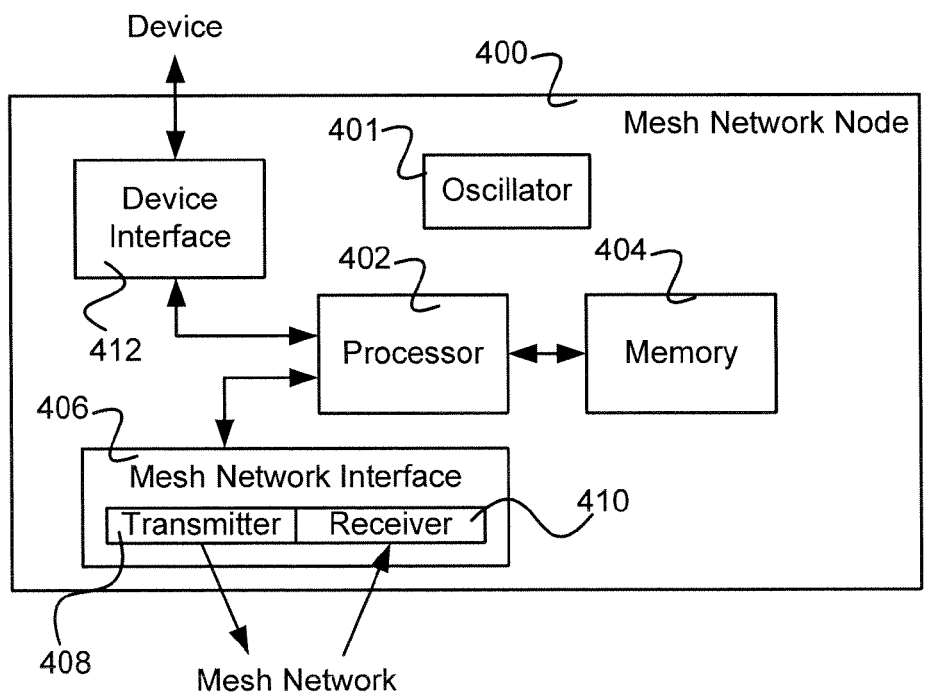
FIG. 4 is a block diagram illustrating an embodiment of a mesh network node of a mesh network.

FIG. 4 is a block diagram illustrating an embodiment of a mesh network node of a mesh network. In some embodiments, the mesh network node 400 of FIG. 4 is used to implement nodes any of nodes N1-N7 in FIG. 1. In the example shown, mesh network node 400 includes processor 402, memory 404, mesh network interface 406, and device interface 412. Processor 402 runs software that when executed operates the mesh network node. Operation of the mesh network node includes setup, receiving messages, transmitting messages, adding capacity, removing capacity, providing status reports to a gateway manager such as gateway 300 in FIG. 3, time synchronization, and/or any other appropriate operating function. Memory 404 provides storage for processor 402 including run-time storage and instruction storage. Mesh network interface 406 includes receiver 410 and transmitter 408. Receiver 410 receives communications in the form of packets transmitted from nodes or gateways of the mesh network. Transmitter 408 transmits communications in the form of packets to nodes or gateways of the mesh network. In some embodiments, mesh network node 400 is battery powered so that power limitations due to finite battery reserves are an issue. Device interface 412 communicates with a device and/or sensor. Device and/or sensor types that can be connected to mesh network node include temperature sensors, strain sensors, image sensors, vibration sensors, fluid level sensors, chemical sensors, gas sensors, radiation detectors, position sensors, acceleration sensors, inclination sensors, shock sensors, infrared sensors, sound sensors, current sensors, voltage sensors, switching device, actuator device, or any other appropriate device and/or sensor. Information to/from the sensor and/or device is passed directly to or processed by sensor mesh network node 400 using processor 402 before passing from/to the mesh network. In some embodiments, mesh network node 400 is compatible with IEEE standard 802.15.4. IEEE 802.15.4 standard relates to low rate wireless personal area networks.

As described in relation to the exemplary transceiver timing diagram of FIG. 2B, power consumption of nodes in a mesh network may be reduced by selectively activating nodes, or components of nodes, for those limited periods of time in a frame slot during which each component is needed (or may be needed) for operation. For example, a node may be activated only during time slots (or portions of time slots) when the node can transmit or receive packets, and during an initialization time period (e.g., period 230) prior to the start of such time slots. In the example, a transmitter of a receiving node may only be activated during a short duration during the time slot when an ACK signal is to be transmitted from the node (e.g., from period 222 to period 226 in the example of FIG. 2B). The node (or components of the node) can remain in a low power (e.g., inactive, standby, or sleep) state of operation when the node is not activate. In the low power, inactive, standby, or sleep state, the node (or components of the node) can either be turned off and consume no power at all, or the node or components thereof can be in a dormant state having a lower power consumption than in an active state.

In order to reduce power consumption in the node when the node is in an inactive (or sleep) state, a high frequency oscillator may be inactivated in the node in favor of using a lower frequency oscillator having a lower power consumption. The lower frequency oscillator may be used to maintain timing information used to selectively activate the node and/or components of the node during time periods when the node and/or components are needed for operation. However, the lower frequency oscillator has a lower timing resolution than the high frequency oscillator, and inherently maintains timing information at the lower time resolution. In order to maintain timing synchronization between the node operating using the lower frequency oscillator, and network systems operating using higher frequency oscillators, timing information may need to be maintained by the node at a resolution higher than the period of the oscillator that is providing the reference clock for the node.

In one example, a node may operate in a network having a slot width of 10 ms. The node may have a primary high frequency oscillator having a frequency of 20 MHz used to maintain timing in the node when the node is in an activated state. The node may also have a secondary low frequency oscillator having a frequency of 32.768 kHz used to maintain timing in the node when the node is in an inactive state (or a sleep state). In the example, the primary oscillator has a period of 0.05 us, and can thus provide high resolution timing information that can be used to maintain synchronization between the node and the network, and to time the beginning and end of 10 ms slots. The secondary oscillator has a period of approximately 30.5 us, which may not in itself provide enough precision to time the beginning and end of 10 ms slots with micro-second precision. Indeed, a 10 ms slot does not correspond to an integer number of 30.5 us periods. In order to maintain synchronization with the network, the node may need to maintain timing information at a resolution higher than the period of the secondary oscillator. The systems of FIGS. 5A and 5B are examples of systems for enabling nodes to maintain timing information at resolutions higher than the periods of nodes' oscillators.

Figure 5A:
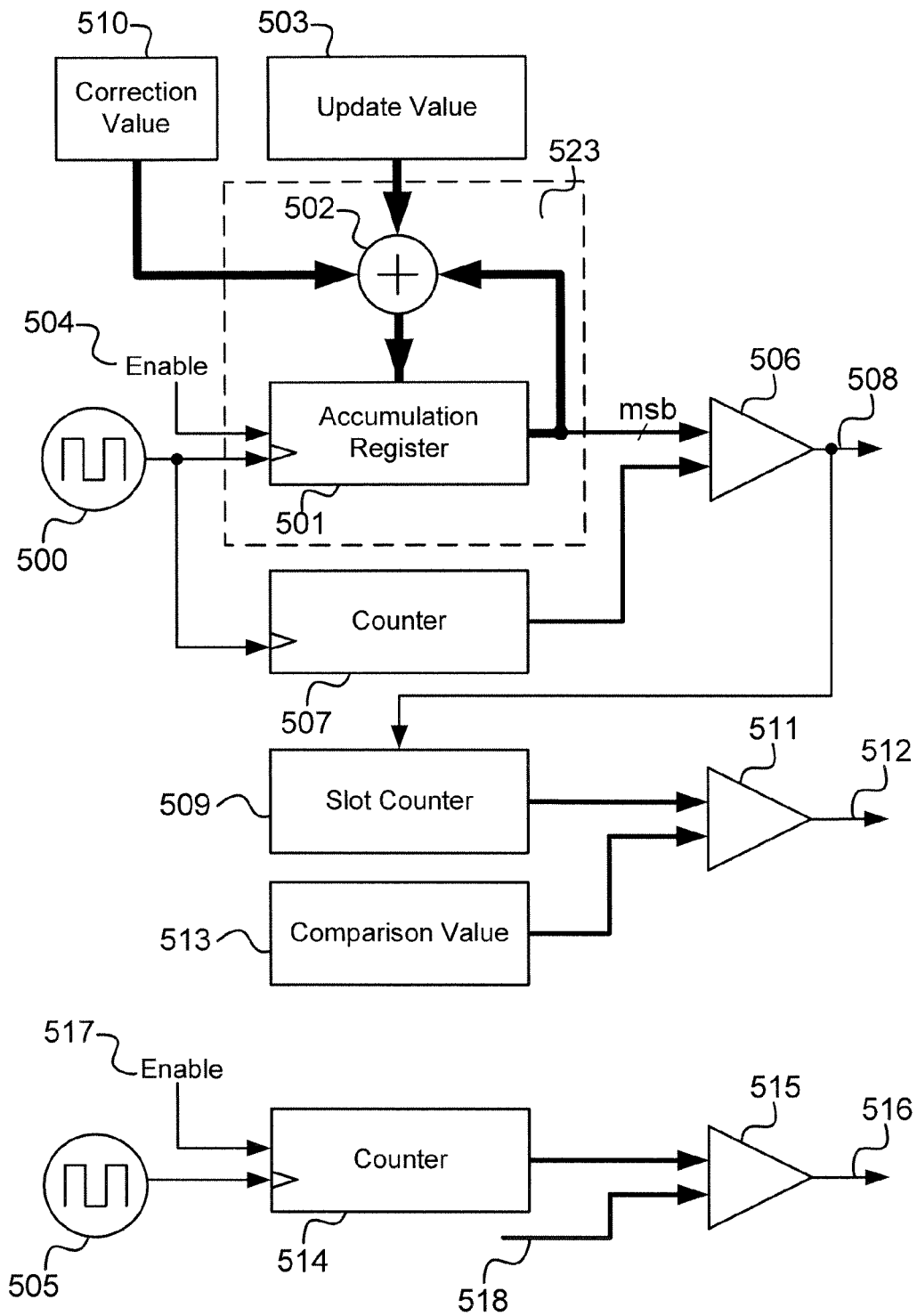
FIG. 5A is a block diagram illustrating an embodiment of a device for timing slots with accuracy greater than its clock source.
Figure 5B:
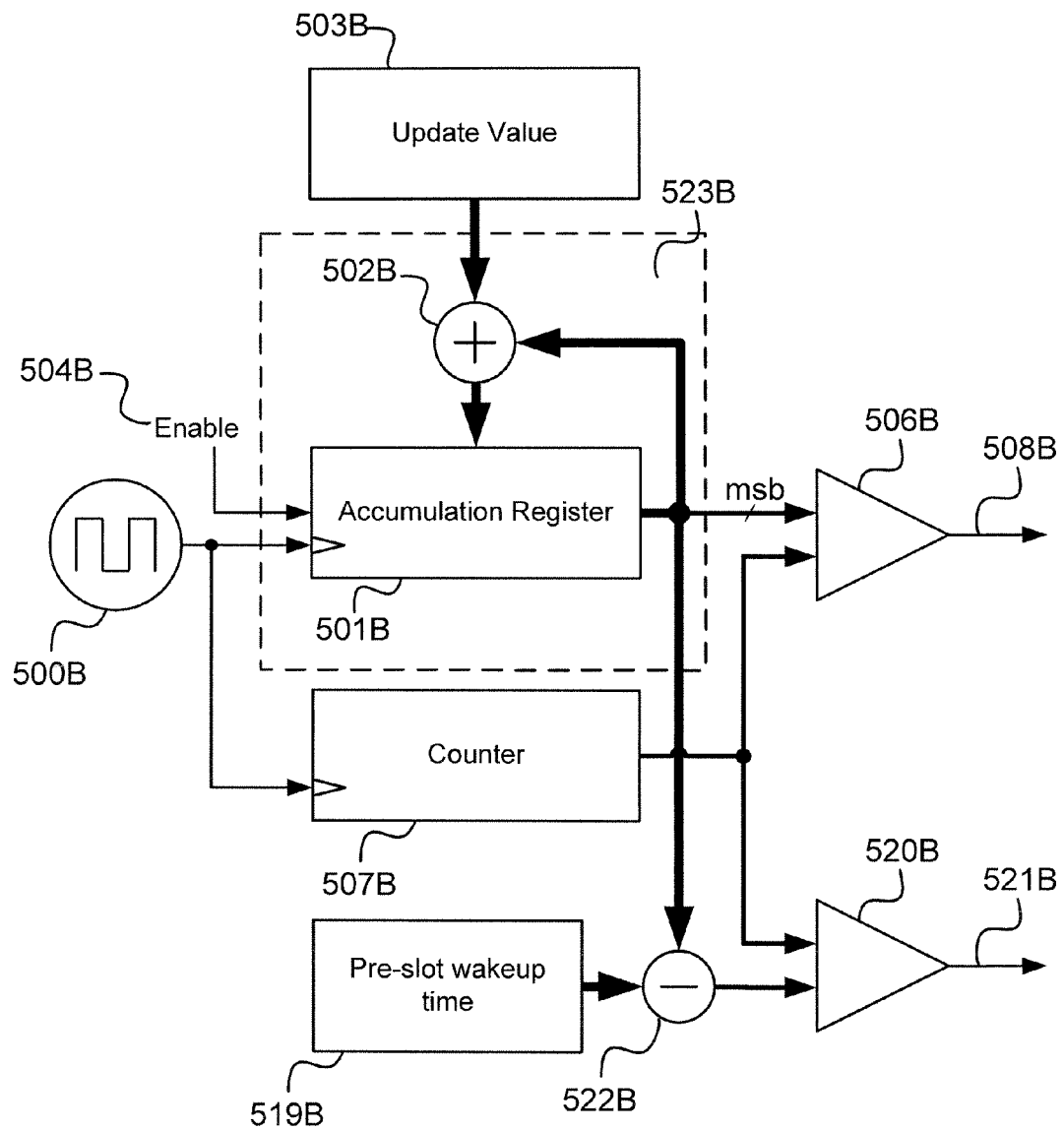
FIG. 5B is a block diagram illustrating an embodiment of a device for timing slots with accuracy greater than its clock source and generating an extra event in advance of the slot edge.

FIG. 5A is a block diagram of a device that allows timing information to be maintained at a resolution higher than the period of the secondary oscillator that is providing the time reference of the node, for example when the node is operating in an inactive state. In some embodiments, this device can be a component of gateway 300 of FIG. 3 or of mesh network node 400 of FIG. 4 to efficiently generate the timing signals for the slots S0...S199 of FIG. 2A. Secondary oscillator 500 is a low power oscillator that causes the accumulator 523 to be updated. In some embodiments oscillator 500 is a 32.768 kHz quartz crystal oscillator. Accumulation register 501 and adder 502 comprise an embodiment of an accumulator 523 wherein the register 501 latches the output of the adder 502 on each active edge of oscillator 500, and the inputs to the adder 502 are the current value in register 501 and a second value in register 503. In some embodiments, an enable signal 504 may cause register 501 to be updated only on certain edges of the oscillator signal (e.g., only on edges of the oscillator 500 output signal during which enable signal 504 is asserted).

Register 503 stores a value that is accumulated and in some embodiments may be a fixed value while in others it may change. In some embodiments, the value in register 503 would correspond to the number of periods of oscillator 500 that correspond to the width of a slot as in FIG. 2A. In one example, the values in registers 501 and 503 can be related to the integer portion of the ratio of the slot width to the period of oscillator 500. In the example, if oscillator 500 has a period of 30.5 us and the slot width is of 10 ms, register 503 may store a value equal to INT (10 ms/30.5 us) 327.

In another example, in order to maintain timing information at a higher resolution, the values of registers 501 and 503 can be related to a multiple of the ratio of the slot width to the period of oscillator 500. For instance, if oscillator 500 has a period of 30.5 us and the slot width is of 10 ms, register 503 may store a value equal to INT(128*10 ms/30.5 us)≈41967 using the multiple '128'. The multiple may enable the value of register 501 to be maintained at a higher resolution, and may thus minimize the rounding errors caused by using accumulation values related to integer portions only. In particular, the use of the multiple may enable registers 501 and 503 to maintain fractional period information. By dividing the output of register 501 by the multiple (e.g., by 128 in the example), an accumulated number corresponding to an approximate number of elapsed slot widths can be retrieved. The multiple may generally be a multiple of 2, such that the output of register 501 can be divided by the multiple by simply retrieving only the most significant bits (msb) at the output of the register (thus dropping a number of least significant bits corresponding to the multiple, e.g., dropping 7 bits in the case of the multiple 128=2^7).

In other embodiments, the values stored in register 501 and 503 may be related to the period of the primary oscillator 505. The values in register 501 and 503 may be an integer number of periods of oscillator 505, but any other ratio could be used. The period of the oscillator 505 is the shortest period used for timing (i.e., maximum timing resolution) in the device, but in general higher frequency oscillators (such as primary oscillator 505) have higher power consumption and result in higher power consumption in the load circuit as compared to lower frequency oscillators (such as secondary oscillator 500).

In some embodiments, oscillator 505 could be turned off much of the time to conserve power. Meanwhile, accumulation register 501 may be incremented with timing information having a resolution related to the timing resolution of counter 514, coupled to the output of oscillator 505. In the example in which oscillators 500 and 505 have respective frequencies of 32.768 kHz and 20 MHz, for example, and a multiple of 128 is used, then register 501 will maintain timing information with a resolution of 30.5 us/128=0.238 us, while register 514 would maintain timing information with a resolution of 0.05 us. For instance, accumulation register 501 may be incremented by a number related to the ratio of the period of the secondary oscillator 500 to the period of the primary oscillator 505, e.g., a multiple of the ratio of the periods. In the example, accumulation register may thus be incremented by a multiple of 238 ns/50 ns=4.76.

Some embodiments will have one or more comparators such as 506 in FIG. 5A that compare the accumulated value in register 501 or some portion of it (e.g., the most significant bits (msb) of the value in the register 501) with a second value 507, which is a counter updated on the oscillator 500, and when a condition such as equality is met, an output signal 508 is asserted. As shown, comparator 506 compares the output of counter 507 with the output of register 501 (or with the most significant bits output by register 501) such that when the value of counter 507 is equal to or greater than the value of register 501 (or the msb of the value), output signal 508 is asserted. In examples in which only the most significant bits of register 501 are compared by comparator 506, the lower bits of register 501 correspond to fractional period information so that register 501 can maintain timing information to a greater resolution.

Output signal 508 of comparator 506 is connected to the enable signal 504 of register 501, causing the accumulation of register 501 to occur when signal 508 is asserted, corresponding to times when the value in counter 507 is equal to or exceeds the value in register 501. Signal 508 is coupled to counter 509 so that it increments each time signal 508 is asserted. If the value stored in register 503 corresponds to the slot width (or to a multiple of the slot width divided by the period of oscillator 500), the value stored in counter 509 corresponds to a count of the number of slots that have elapsed.

In some embodiments, the value in the accumulator may be occasionally adjusted by correction value 510 to maintain synchronization with another device or to correct for errors in the frequency of oscillator 500. The value in 510 can have a timing resolution that allows for more precise time measurement than the period of 500, e.g. a timing precision similar to that of registers 501 and 503.

Some embodiments will have one or more comparators such as 511 that compare the value in the slot counter 509 with a second value 513 and then assert output signal 512 when a condition such as equality is met. The comparison value 513 would contain the slot number at which some event should occur. For example, if the node should be activated after a number X of slots have elapsed, register 513 can store the number X such that the output signal 512 is asserted when the node should be activated.

Some embodiments will have a counter 514 that is updated by the primary oscillator 505. In one embodiment, the counter has an enable input receiving a signal 517 that is coupled to the signal 512 such that it counts when signal 512 is asserted. A comparator 515 can compare the count value in 514 to the fractional part of the value in register 501 (e.g., in embodiments in which the output of register 501, including the least significant bits, is received through input 518) to generate an output signal 516 that is asserted when the value in the accumulator has been reached to its full precision. Thus, for much of the time only timing components 500, 501, 502, 503, 506, 507, 509, 511, and 513 are active, operating at a low frequency, low power level. However, when counter 509 reaches the value in register 513, signal 512 will be asserted and cause the counter 514 to be enabled to measure out the remaining time until the event should occur to a resolution of the 505 oscillator. In this scenario, the oscillator 505 will need to be enabled some time prior to 512 being asserted.

In another embodiment, the counter has an enable input receiving a signal 517 that is coupled to the signal 508 such that it counts when signal 508 is asserted. Thus, for much of the time only timing components 500, 501, 502, 503, 506, and 507 are active, operating at a low frequency, low power level. However, when counter 507 reaches the value in register 501 to within one period of oscillator 500, signal 508 will be asserted and cause the counter 514 to be enabled to measure out the remaining time until the event should occur to a resolution of the 505 oscillator. In this scenario, the oscillator 505 will need to be enabled some time prior to 508 being asserted, as described in the next paragraph.

FIG. 5B shows another embodiment of the device in FIG. 5A wherein 507B is a counter that is updated by secondary oscillator 500B and whose output is compared with a value in register 501B by comparator 506B. A circuit is added that allows a second signal 521B to be generated a specified amount of time before signal 508B (corresponding to signal 508 of FIG. 5A) is asserted. This provides a mechanism for generating a timing signal for activating a node (or one or more components of a node) a specified time prior to the beginning of a slot. For example, the mechanism can be used to generate a signal 521B for turning on a primary oscillator 505 (e.g., for turning on the oscillator in time periods 212 and 213 prior to the slot edge 210 of FIG. 2B) or regulators (e.g., for turning on regulators in time periods 214 and 215 prior to the slot edge 210 of FIG. 2B) that may need time to stabilize prior to the slot edge (e.g., slot edge 210 in FIG. 2B).

Register 519B stores a number corresponding to the number of counts of counter 507B before the slot edge at which signal 521B should be asserted. Since counter 507B counts periods of secondary oscillator 500B, the value in register 501B corresponds to the time of the next slot edge 210 in counts of counter 507B plus a fractional period. The value in register 519B is subtracted by subtractor 522B from the value in register 501B and the result is compared by comparator 520B to the value in counter 507B. Thus, as counter 507B counts it will first reach the value at the output of subtractor 522B (that is, the value in register 501B less the value in register 519B) and cause signal 521B to be asserted. Subsequently, counter 507B will reach the value in register 501B and signal 508B will be asserted. The value in register 519B may include fractional period information, as may counter 507B and the input of subtractor 522B received from register 501B, and the comparison 520B may then compare higher resolution signals.

Since the device is of finite size, register 501B and counter 507B will eventually overflow. As long as the values are wide enough to yield unique values over the short time frames in which comparisons are made, the rollover or overflow need not be of concern and thus the registers can be kept small to minimize the size of the device and leakage power consumption. For example, the maximum value of register 501B need only be slightly larger than twice the maximum value of register 503B. Even if counter 507B is larger than this, comparator 506B need only compare the width of counter 507B that corresponds to the width of register 501B with overflows just causing the register to wrap around but still having only one unique time of equality.

Some embodiments will have an additional slot offset counter 600 of FIG. 6 that is coupled through 601 to the oscillator 500 and thus updated by it. It is also coupled to the signal 508 through 602 and is reset to an initial value each time signal 508 is asserted. This counter thus subdivides the slot and yields the number of periods of the oscillator 500 that have elapsed since the beginning of the slot (i.e., since the last slot edge). There can then be an additional comparator 603 that generates an output signal 605 when the counter 600 reaches a specified comparison value stored in register 604, which indicates a particular point within a slot. In one example, signal 605 is coupled to enable signal 517 of FIG. 5A such that counter 514 begins counting at a chosen time (determined by the value stored in register 604) within the slot. In general, the value stored in register 604 may be an integer number of periods that are directly compared to the number stored in counter 600. In some examples, however, the value stored in register 604 may be a fractional period in which case the fractional period is added to the fractional period in register 501B and the sum is used as the comparison value 518 for comparator 515. In this manner signal 516 will be asserted at a time that has a resolution less than the period of oscillator 500 after the slot edge, which itself was determined with a resolution less than the period of oscillator 500.

Some embodiments may contain an additional circuit that stores the state of the elements of the device such as the contents of register 501, slot counter 509, and slot offset counter 600 when a trigger signal changes state. In one example, the trigger signal is a device input signal (e.g., a chip input signal) which can be used to trigger the storing of register state information of the device.

In one example, the trigger signal is connected to input terminal 702 of counter 701, as shown in FIG. 7. Counter 701, as shown in FIG. 7, is updated by an oscillator 700 that has a frequency greater than that of the secondary oscillator 500 and may be the same frequency as that provided by primary oscillator 505. Oscillator 700 provides timing to a resolution greater than the period of oscillator 500. A trigger signal is provided to the enable input 702 of counter 701, such that counter 701 is enabled when the trigger signal is in a particular state (e.g., when the trigger signal is in a high logic state). The counter 701 is additionally coupled to oscillator 500 through signal 703, such that the counter 701 is reset to an initial value on or near an edge of the oscillator's output signal. When the trigger signal changes state (e.g., transitions from a high state to a low state), the value of counter 701 will be incremented and held or transferred to another storage circuit. The value of counter 701 can then be obtained from the output of counter 701. This allows the precise time at which another event occurred (as determined by the time when the trigger signal transitioned to the low state) to be measured in terms of slot number, time within the slot to a resolution of the period of oscillator 500, and time within the period of oscillator 500 to a resolution of the period of oscillator 700 thereby enabling time-stamping of an event to the precision of a high-frequency oscillator without keeping such a high power device operating continuously.

The trigger signal can additionally be used to store the state of register 600 of FIG. 6. For example, an enable input to counter 600 may be coupled to an output of an OR gate, where the OR gate receives at its inputs the signal 508 and the trigger signal. The counter would still receive signal 508 at its reset input 602. As a result, when signal 508 transitioned from low to high states, the counter 600 would be reset and begin counting from its reset value at the rate of the frequency of oscillator 500 coupled to clock input 601. As long as the trigger signal remains high, the counter 600 would continued counting even if signal 508 returned to a low value. However, when the trigger signal would transition from a high state to a low state, the value of counter 600 would be held or transferred to another storage circuit.

Finally, the trigger signal can be used to obtain a value of the slot offset value (i.e., the number of periods following the last slot edge) by retrieving the value of counter 507 when the trigger signal transitions from a high value to a low value, and by subtracting from the value of counter 507 the value held in register 501 at the last slot edge. The value held in register 501 at the last slot edge can be determined by retrieving the values of registers 501 and 503, and calculating the difference of (value in 501)–(value in 503).

Figure 8A:
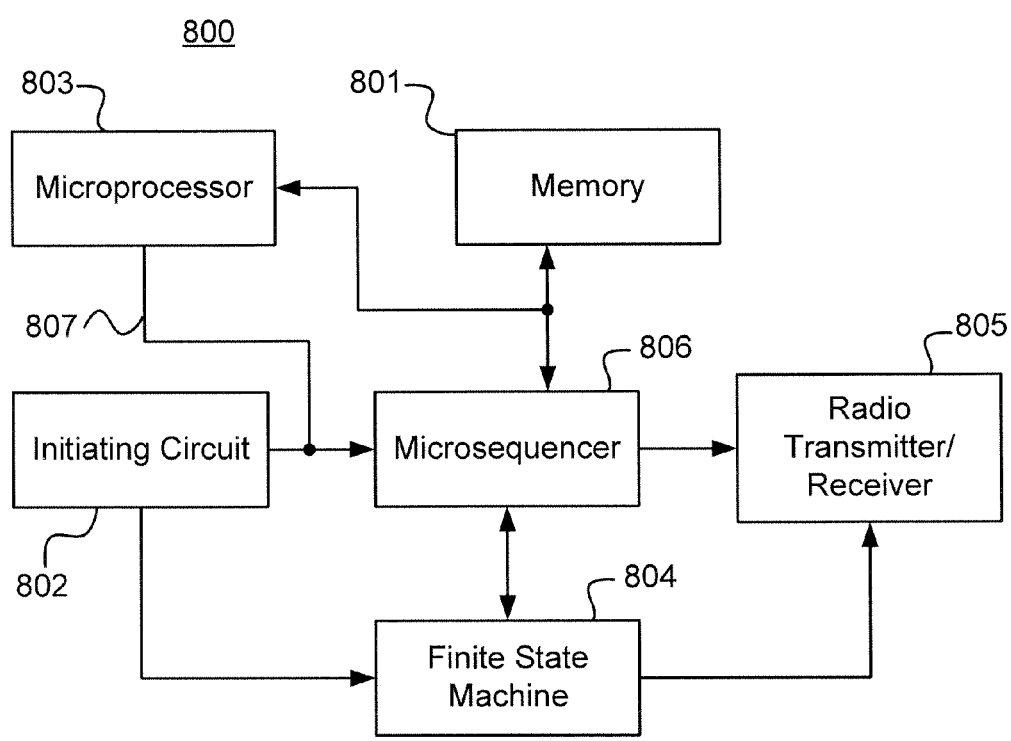
FIG. 8A is a block diagram illustrating an embodiment of a device for executing a sequence of configuration steps for an integrated radio transmitter or receiver.

FIG. 8A shows a block diagram of a device 800 for executing a sequence of configuration steps for an integrated radio transmitter or receiver 805. The device 800 includes a microsequencer 806 that reads configuration steps from a coupled memory 801 and then executes the steps. Memory 801 may be a static random access memory (SRAM) that contains a plurality of sequences of configuration steps, and may not be solely coupled to microsequencer 806. In some embodiments, the memory 801 is a dynamic RAM, a ferroelectric RAM, a magnetoresistive RAM, a phase-change memory, a resistive RAM, a flash memory, or a memory using any other appropriate storage technology. The device 800 can also include an initiating circuit 802 configured to trigger the microsequencer 806 to begin retrieving and executing a sequence of configuration steps from memory 801. The initiating circuit may include timing circuitry, such as the timing circuitry shown and described in relation to FIGS. 5A, 5B, 6, and 7, used to generate a timing trigger signal for activating the microsequencer 806. A microprocessor 803 in the device 800 is used to configure microsequencer 806, and to generate and store in memory 801 the sequences of configuration steps. Microprocessor 803 may also be used to initiate a sequence through coupling 807.

Because the sequence of configuration steps is stored in memory 801, the sequence may be changed simply by changing the contents of memory 801. Being able to change the configuration steps is advantageous for several reasons including: allowing multiple protocols to be used with a single integrated circuit; allowing multiple features to be configured as needed (e.g. enable/disable clear channel assessment, time of flight measurements, external power amplifier toggling); the hardcoded finite state machines (FSMs) conventionally used to configure a radio may be made simpler thereby reducing the probability of a design flaw necessitating a design revision; and increased flexibility to work around errors in the design of the radio or control circuits. Since most of the configuration steps are simple (including, for example, steps such as steps to: write register/ set clear bits/pause for a period of time, etc.), microsequencer 806 has a reduced functionality as compared to microprocessor 803 resulting in substantially reduced power consumption as well as a smaller circuit area compared to a separate microprocessor being used to configure the radio.

Some ways that the microsequencer functionality may be reduced include having fewer instructions, having fewer classes of instructions, such as no branch and ALU instructions, and having uniform and fixed fields in the instruction set encoding. With these reductions, the power consumed by the microsequencer 806 for each operation can be less than the power consumed by the microprocessor 803 to perform the same operation, since there are fewer gates that are switching, gate fan-ins and fan-outs are reduced, and the parasitic capacitance is reduced due to less routing in a smaller design and the smaller transistors necessary to drive the smaller design. In some embodiments, microsequencer 806 is a small microprocessor. For example, in one embodiment microprocessor 803 is a 32-bit ARM Cortex-M3 core while microsequencer 806 is an 8-bit 8051 core. The microprocessor 803 can remain disabled, thus conserving power, or can be freed up to perform higher level and less timing critical tasks, while the microsequencer 806 is performing the operations set out in the configuration steps. By causing many timing-critical sections of code to be performed by the microsequencer 806 instead of the microprocessor 803, the worst case throughput of the microprocessor 803 can be reduced and the software design simplified, thereby reducing development time and debugging time. The microsequencer 806 also makes controlling and configuring the radio 805 more efficient, such as by using simple delay instructions and mechanisms to delay executing an operation until a precise time provided in the instruction.

Initiating circuit 802 may contain a plurality of subcircuits and corresponding output signals configured to cause microsequencer 806 to select a corresponding sequence of configuration steps from memory 801 to fetch and execute. In some embodiments, initiating circuit 802 may include a timer and associated timing circuitry, such as timing circuitry 500, 501, 506, 507, and 508 of FIG. 5A. For example, the microsequencer 806 can be triggered by an output signal 508 when a counter 507 reaches the value stored in register 501, and/or by an output signal 521B when a counter 507B reaches the value output by subtractor 522B. The initiating circuit 802 can also include elements 505, 514, 518, and 515 coupled to microsequencer 806 by signal 516 to cause the microsequencer to pause execution until signal 516 is asserted, for example to allow the microsequencer 806 to execute configuration steps at precise times. Comparison value 518 may be a value specified in the instruction that was fetched from memory 801. If the value in counter 514 is greater than that of 518 when the instruction is executed, a flag may be set to indicate that the configuration step is late.

Examples of commands that some embodiments of microsequencer 806 may execute include commands to write to memory, set a bit or field, clear a bit or field, poll until a bit is set, poll until a bit is cleared, perform no operation, stop the current operation and continue to the next one if the specified bit is set, stop the current operation and continue to the next one if the specified bit is cleared, abort the sequence on the specified bit being set, abort the sequence on the specified bit being cleared, bit/field clear with the radio channel as an addressing offset, delay a certain number of clock cycles, and end of sequence. Using these commands microsequencer 806 can perform configuration operations such as setting the channel on which a radio should operate, enabling circuits, and checking for certain conditions, such as a phase locked loop being locked, yet perform them with a time precision that is usually not possible with software running on a general purpose microprocessor.

While a hardware peripheral can generally generate an interrupt to a microprocessor at a precise time, the time at which the interrupt is serviced and software associated with the interrupt is run on the microprocessor may be delayed, for example if the microprocessor has to then spend time context switching, servicing higher priority interrupts, or executing a critical section of code in which interrupts are disabled. Similarly, if software is polling a bit or a register waiting for a certain condition, there can be unpredictability in the time at which software discovers the desired condition, for example due to the execution loop of the software taking more than one clock cycle, or due to an interrupt or context switch occurring in the loop and causing the software to have a long delay in checking the bit or register. If a high-level programming language is used, the time that a section of code takes to execute can vary from compilation to compilation if the algorithms cause nearby code changes to impact the critical region. Similarly, changing compiler versions can affect the number of cycles that it takes a critical section to run. However, the microsequencer 806 has a dedicated function, is simple to program without a high-level compiler, and has a close coupling to the hardware to prevent these problems. As such, the microsequencer 806 may be capable of executing the configuration steps more promptly and reliably than a general purpose microprocessor.

Figure 8B:
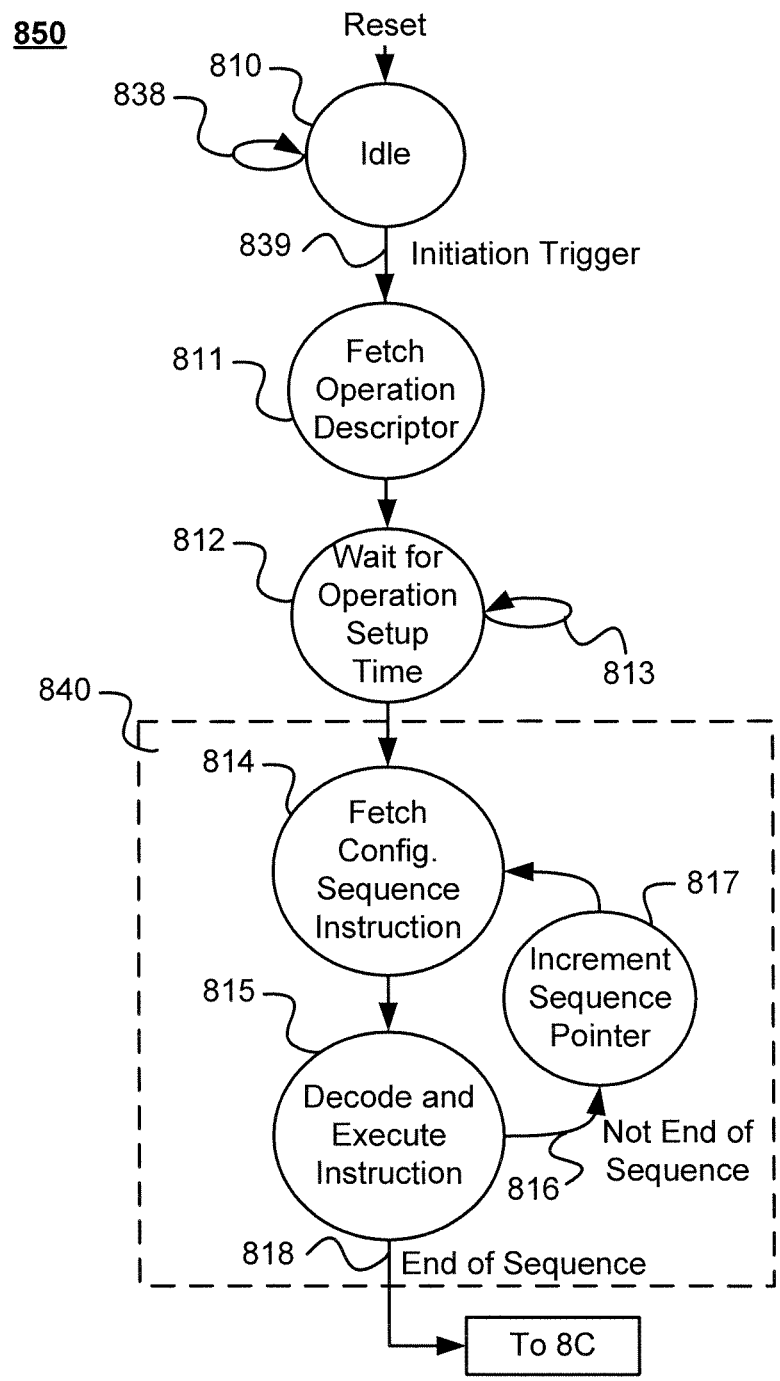
FIGS. 8B and 8C are a state diagram illustrating a finite state machine that incorporates a programmable microsequencer for configuring and controlling an integrated transmitter or receiver.
Figure 8C:
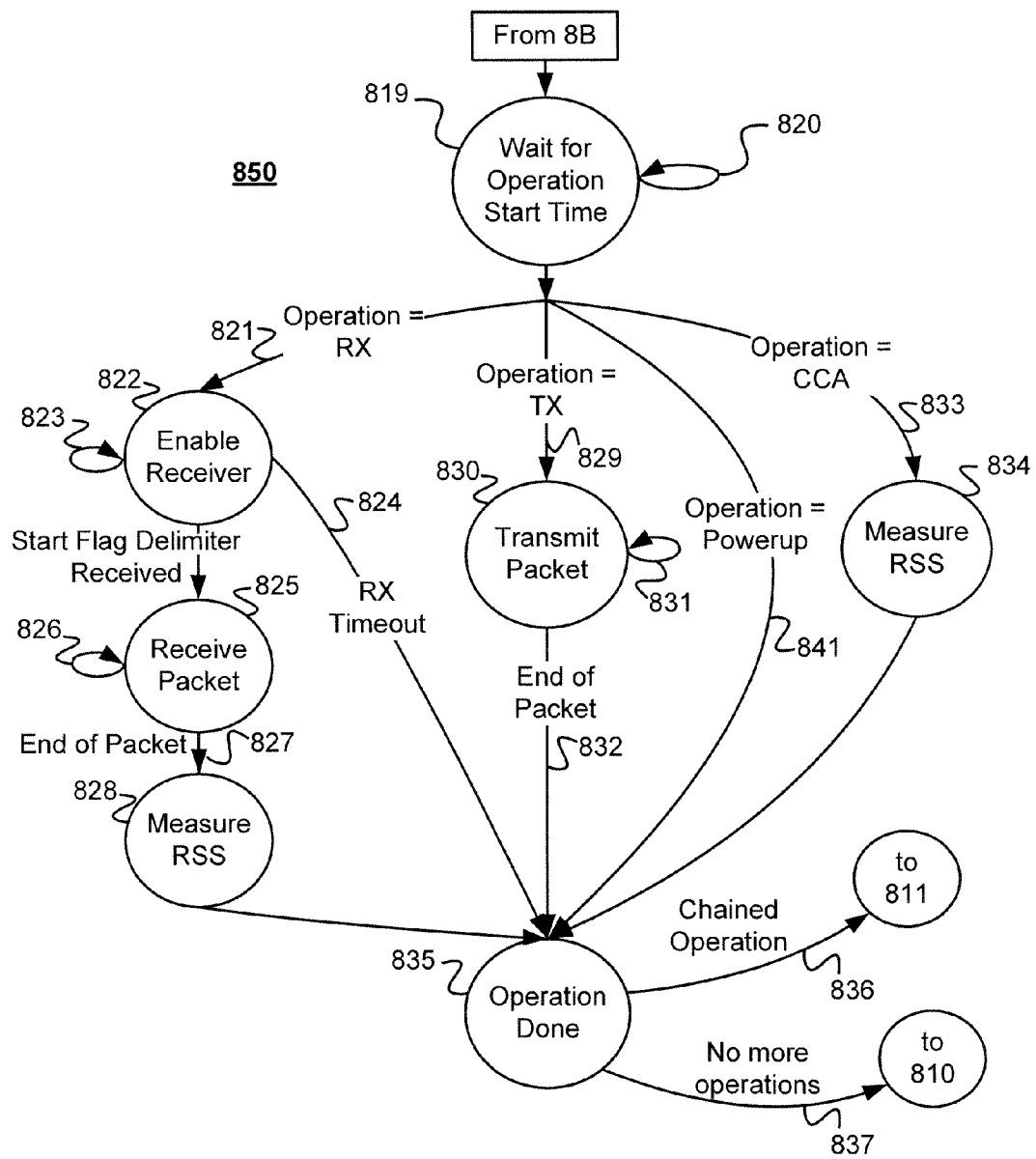

In some embodiments, microsequencer 806 may be coupled to a finite state machine (FSM) 804 that performs additional control operations when triggered by the microsequencer 806 or the initiating circuit 802 and can interact with the processing of the sequence by microsequencer 806. FIGS. 8B and 8C show an exemplary state diagram of a method 850 for execution by a FSM such as FSM 804 working together with a microsequencer 806, illustrating the tight operational coupling between the microsequencer 806 and FSM 804 that is possible.

Method 850 begins at reset, when the idle state 810 is entered and the device remains in the idle state as shown by transition 838. When initiating circuit 802 triggers the FSM 804, state transition 839 is used to enter state 811 wherein data containing an operation descriptor is fetched from memory 801. The retrieved operation descriptor, which may have the exemplary fields shown in FIG. 8D, can specify which operation (field 850) should be performed by the FSM, how much setup time (field 851) the configuration sequence requires, the radio channel (field 852), the offset (field 853) into the slot at which the operation is to occur, the slot number (field 854) at which the operation should occur, a pointer (field 857) to a configuration sequence, and a pointer (field 856) to the next operation descriptor. In state 812, the FSM will wait an amount of time specified by an operation setup time (transition 813), for example by waiting until slot counter 509 of FIG. 5A matches a particular slot number and the offset (retrieved from field 853) into the slot minus the setup time (retrieved from field 851) is reached as indicated by slot offset counter 600.

In state 814, pointer 857 is used to fetch the first instruction of the configuration sequence from memory 801. In state 815 the retrieved instruction is decoded and executed. In some embodiments the execution may simply involve combinatorial logic due to the simple instruction set and fixed fields. In some embodiments the execution may involve another FSM carrying out several steps. If the instruction does not specify that the end of the sequence has been reached, transition 816 is taken to state 817 wherein the pointer to the configuration sequence is incremented. The FSM then returns to state 814 where the next instruction in the configuration sequence is fetched. This process continues until an instruction is read that specifies the end of the sequence, at which point transition 818 will be made from state 815. The end of the sequence can be indicated by a special bit within the instruction encoding, a dedicated instruction, a particular value within a specific field, or the state of a bit in a register specified in the instruction. States 814, 815, 817 and transitions 816 and 818, identified by box 840 in FIG. 8B, illustrate operations that can be performed by the microsequencer 806. The configuration sequence for an operation (such as operation 217 of FIG. 2B) for configuring and enabling the transmitter can have the following steps:
1. Set bit to enable sequence done interrupt.
2. Stop the sequence if a general purpose chip input is asserted to inhibit radio transmission.
3. Set a bit in memory 801 that acts as a flag to the microprocessor 803 indicating that the transmit sequence is in progress.
4. Set bit to configure the RX/TX switch in the path to the antenna to the TX path.
5. Set bit field to control a bias setting to reduce spectral splatter when the transmitter is turned on.
6. Write a register with transmitter trim settings from calibration testing.
7. Write register with channel specific parameters.
8. Set bit field to configure filter for startup.
9. Write register to enable various parts of the transmitter chain.
10. Delay while phase locked loop (PLL) settles and locks onto a signal frequency.
11. Set bit field to reconfigure filter now that startup is complete.
12. Write register with settings specific to the slot and the receiver.
13. Poll while bit indicating PLL lock status is clear.
14. Write a register with transmitter trim settings from calibration testing applicable after PLL lock.
15. Set bit field to change a bias setting now that the transmitter is stable.

Following the detection of an instruction that specifies the end of the sequence (transition 818 of FIG. 8B), the FSM waits (state 819 and transition 820) until the operation start time (retrieved from field 853) is reached (e.g., as shown in periods 234 and 233 of FIG. 2B) by applying the appropriate portions of field 853 to comparison values 518 and 604 and monitoring signals 516 and 605. The next state transition depends on the operation specified in field 850. Examples of operations include radio powerup, radio receive, radio transmit, radio receiver disable, radio transmitter disable, radio powerdown, no operation, radio clear channel assessment (CCA), radio receive acknowledgement (ACK), and radio transmit ACK. FIG. 8C illustrates the operations undertaken for a few of the possible operations. Some of these operations, such as radio powerup, radio receiver/transmitter disable, and no operation, result in the configuration sequence being executed and then transition 841 being followed to state 835 without performing any additional operations.

If the operation 850 is radio transmit, then transition 829 is followed from state 819 to state 830. In state 830, the packet will be transmitted (e.g., during period 219 of FIG. 2B). The wait in state 819 (illustrated as time period 234 in FIG. 2B, and transition 820 in FIG. 8C) thus allows the transmission to occur at a precise time (e.g., time 231) to allow the receiver to measure the synchronization error and to minimize the time that its receiver needs to be enabled. When packet transmission is complete, transition 832 is taken to state 835.

If instead operation 850 is to measure CCA, transition 833 will be made from state 819 to state 834 where the received signal strength (RSS) is measured. At the completion of the measurement, state 835 is entered.

If operation 850 is radio receive, transition 821 is taken to state 822 where the receiver is fully enabled (the configuration sequence may have partially enabled it) to receive (e.g., to perform a receive operation as in period 218 in FIG. 2B). The precise wait (illustrated as period 233 in FIG. 2B) that occurred in state 819 prior to taking transition 821 allows the receiver to be turned on the minimum amount of time 237, prior to time 231, necessary given the synchronization error with respect to the transmitter, which helps reduce the current consumption. The FSM 804 stays in state 822 via transition 823 until the packet preamble and start flag delimiter (SFD) have been received, at which point it transitions to state 825. When the SFD is received the values in counters 514 and 600 are latched to provide a precise measurement of the arrival time of the packet. By comparing the latched counts to the expected arrival time, the synchronization error can be determined and the correction value applied to 510. When state 822 is entered, a timer is started wherein if the SFD has not been received by the time the timer expires, transition 824 to state 835 is made indicating that the receive operation timed out. In state 825 the remainder of the packet is received and stored into memory 801. When the end of the packet is reached, transition 827 is made to state 828 where the RSS is measured. At the completion of the measurement, state 835 is entered.

In state 835, if the next operation descriptor pointer (e.g., retrieve from field 856) contains a valid pointer, transition 836 is made back to state 811 where the operation descriptor specified by pointer 856 is fetched and the process begun again. This allows operations to be chained together to perform sequences of operations such as radio powerup (including the operations specified in periods 212 and 214 of FIG. 2B) followed by radio receive (including the operations specified in periods 216, 233, 237, and 218)→followed by radio receive disable (220) followed by radio transmit ACK (222, 235, 224)→followed by radio transmit disable (226) →followed by radio powerdown (228). Thus an entire timeslot of FIG. 2B can be setup by microprocessor 803 beforehand and will occur automatically as needed without further or urgent processor intervention (e.g., invention by microprocessor 803).

If a pointer retrieved from field 856 is invalid, then no more operations are desired and transition 837 is made back to the idle state 810. At this point the FSM can generate an interrupt to the microprocessor 803 to indicate that the operations have been completed and that the processor can perform any additional processing of the packets and update the operation descriptors for the next desired action. In some embodiments the microprocessor 803 may initiate a cryptographic operation, such as Advanced Encryption Standard (AES) decryption or authentication, an error detection code, or an error correction code on the received packet.

Figure 9A:
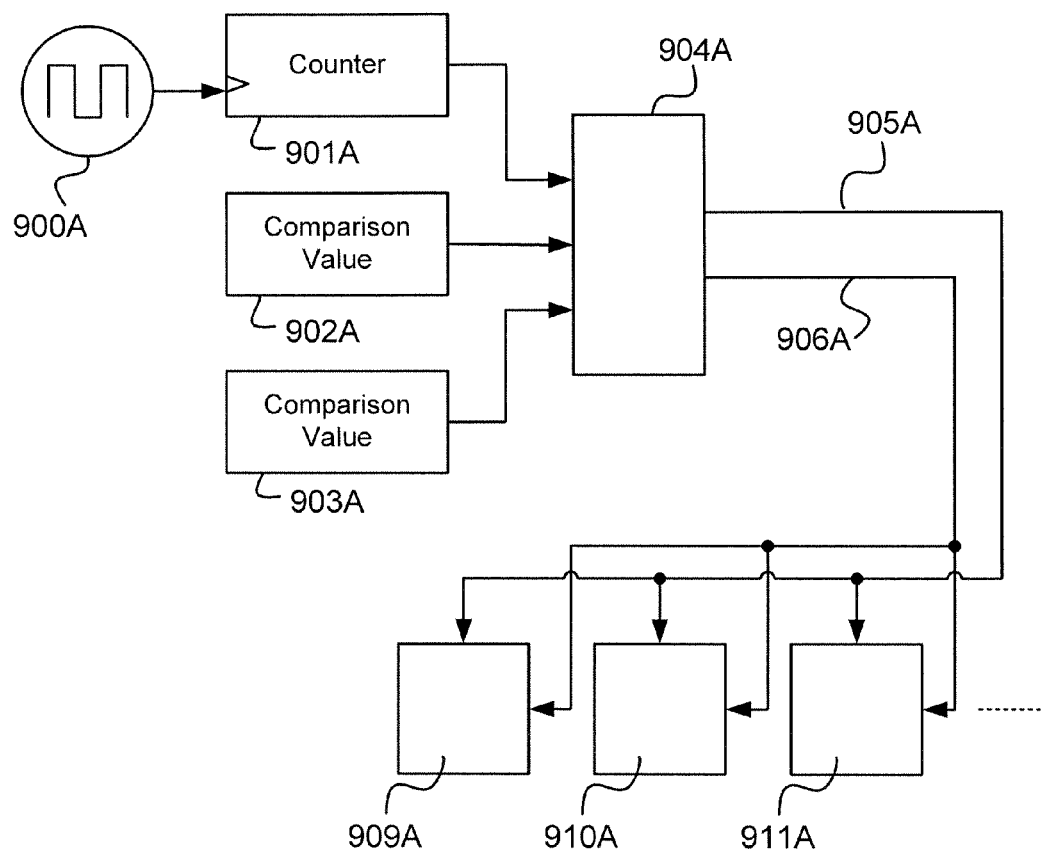
FIG. 9A is a block diagram illustrating an embodiment of a device for triggering events in a power-cycled system on a flexible time schedule.

FIG. 9A shows a block diagram of a device for triggering events on a time schedule comprising a clock signal, such as an output signal from oscillator 900A, a counter 901A receiving the clock signal at an input, two registers 902A and 903A storing comparison values, and a comparison block 904A. Additionally the device includes one or more components such as components 909A, 910A, and 911A that can be in one or more states of power activity/consumption (e.g., active/activated states, or inactive/sleep states). When the counter 901A reaches a value that is greater than or equal to the comparison value stored in register 902A, the output signal 905A can become asserted to request some action to be performed by one or more of components 909A, 910A, and 911A but without changing the power state of the components. If 909A, 910A, or 911A are already in a power state such that they can act on the request, the components may perform the action related to the request immediately. When the counter subsequently reaches a value that is greater than or equal to the comparison value stored in register 903A, the output signal 906A can become asserted to cause the power state of one or more of the components 909A, 910A, and 911A to change, allowing the request signal 905A to be acted upon if one or more of the components become activated. The device may contain other components (e.g., components other than counter 901A, register 903A, and output signal 906A of comparison block 904A) that can cause the power state of one or more of components 909A, 910A, and 911A to change. If the power state of one of the components changes after signal 905A becomes asserted but before signal 906A has caused the power state to change, then the request related to signal 905A will be acted upon at that time (i.e., when the power state of one of the components changes). The comparison value stored in register 903A generally is larger than the comparison value stored in register 902A (i.e., larger in absolute value, such that register 903A stores a larger positive number or a smaller negative number than register 902A), such that the counter reaches the value stored in register 902A before reaching the value stored in register 903A. For example, in embodiments in which counter 901A is an up-counter, register 903A may store a larger positive number than register 902A. In embodiments in which counter 901A is a down-counter, register 903A may store a "more negative" number than register 902A (such that the value in register 903A is smaller than the value in register 902A, but the value in register 903A has a larger absolute value than that in register 902A).

Examples of requests that signal 905A may make include triggering an analog-to-digital converter (ADC) to take a sample, causing an interrupt request to a microprocessor, triggering the microsequencer 806 in FIG. 8A (e.g., in an example in which initiating circuit 802 includes the device of FIG. 9A), triggering a radio to perform some operation, or providing an input to a finite state machine. Examples of power state changes that signal 906A may cause include turning on power regulators, a DC-DC converter, oscillators, clocks, changing voltage levels of power sources, closing power switches, and changing transistor back-biasing. Embodiments of the invention may include additional comparison values and comparators that generate additional signals causing different requests and different power state changes.

In one example, the device in FIG. 9A can be used to schedule the performance of a task to be completed approximately 5 ms from now, but that can be completed anytime as early as 4.5 ms from now and as late as 5.4 ms from now. In the example, register 902A is loaded with a value that corresponds to 4.5 ms from now (e.g., by storing a number in register 902A that the counter 901A is expected to reach in 4.5 ms) and register 903A is loaded with a value that corresponds to 5.4 ms from now (e.g., by storing a number in register 903A that the counter 901A is expected to reach in 5.4 ms). After 4.5 ms have elapsed (as determined by counter 901A), signal 905A will become asserted and if the device happens to be awake at that time, the task will be performed immediately. However, if the device is sleeping after the 4.5 ms have elapsed, the task will not be performed right away. If there is an event, such as data being received on a UART port, that causes the device to wake up in 5.2 ms, then the scheduled task will be performed at that time. On the other hand, if after 5.4 ms have elapsed (as determined by counter 901A) the device has not woken up, the device will be forced awake by output signal 906A and the task will be performed at that time.

Figure 9B:
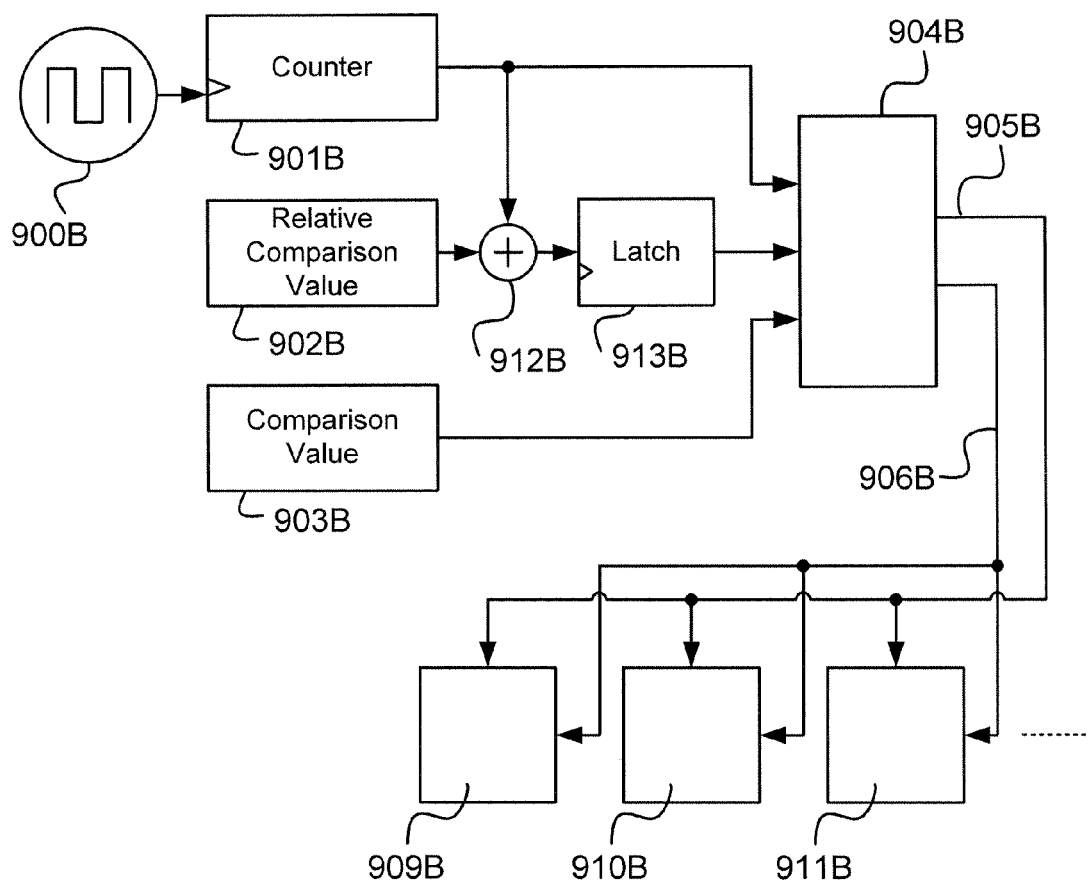
FIG. 9B is a block diagram illustrating an embodiment of a device for triggering events in a power-cycled system on a flexible time schedule wherein one comparison value is relative to the time counter.

FIG. 9B shows the block diagram of another embodiment of the device in FIG. 9A. Register 902B contains a relative comparison value that is relative to the value of the counter 901B at the time that 902B is loaded. When 902B is loaded, the value stored in the register is added to that in counter 901B by adder 912B and the result is stored into latch 913B and subsequently used by the comparison block 904B.

Figure 9C:
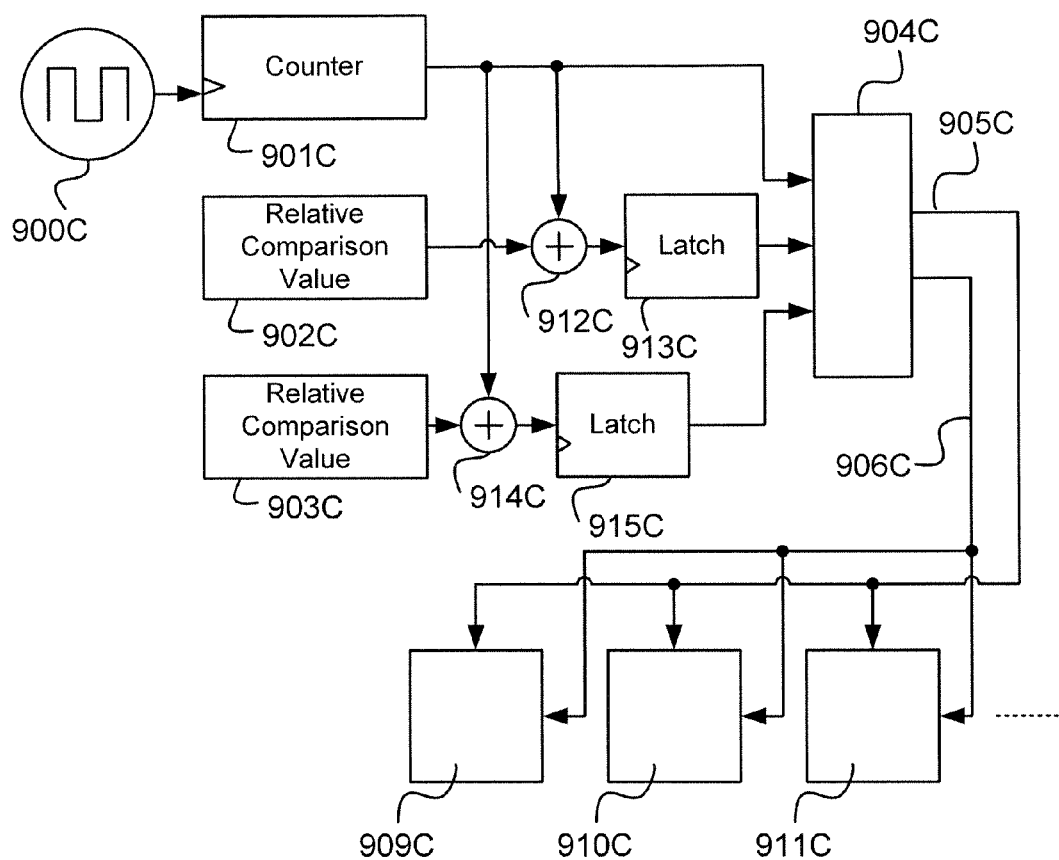
FIG. 9C is a block diagram illustrating an embodiment of a device for triggering events in a power-cycled system on a flexible time schedule wherein both comparison values are relative to the time counter.

FIG. 9C shows a further embodiment wherein registers 902C and 903C both contain values that are relative to the current value in counter 901C. When register 902C is loaded, its value is added to that in counter 901C by adder 912C and the result is stored into latch 913C and subsequently used by the comparison block 904C. When 903C is loaded, its value is added to that in counter 901C by adder 914C and the result is stored into latch 915C and subsequently used by the comparison block 904C. When the value output by counter 901C is greater than or equal to the value in latch 913C, comparison block 904C will assert the request signal 905C. When counter 901C is greater than or equal to the value in latch 915C, comparison block 904C will assert the power change signal 906C. In some embodiments, when the power change signal 906C is asserted, latches 913C and 915C can be triggered again such that they are reloaded with new values of the current counter value in 901C added to the relative comparison values in 902C and 903C. In other embodiments, when the request signal 905C is asserted, latches 913C and 915C can be triggered again such that they are reloaded with new values of the current counter value in 901C added to the relative comparison values in 902C and 903C. The automatic triggering of the latches 913C and 915C upon signal 905C or signal 906C being asserted allows the device to rearm itself and generate periodic requests on 905C and periodic power change signals on 906C.

Figure 9D:
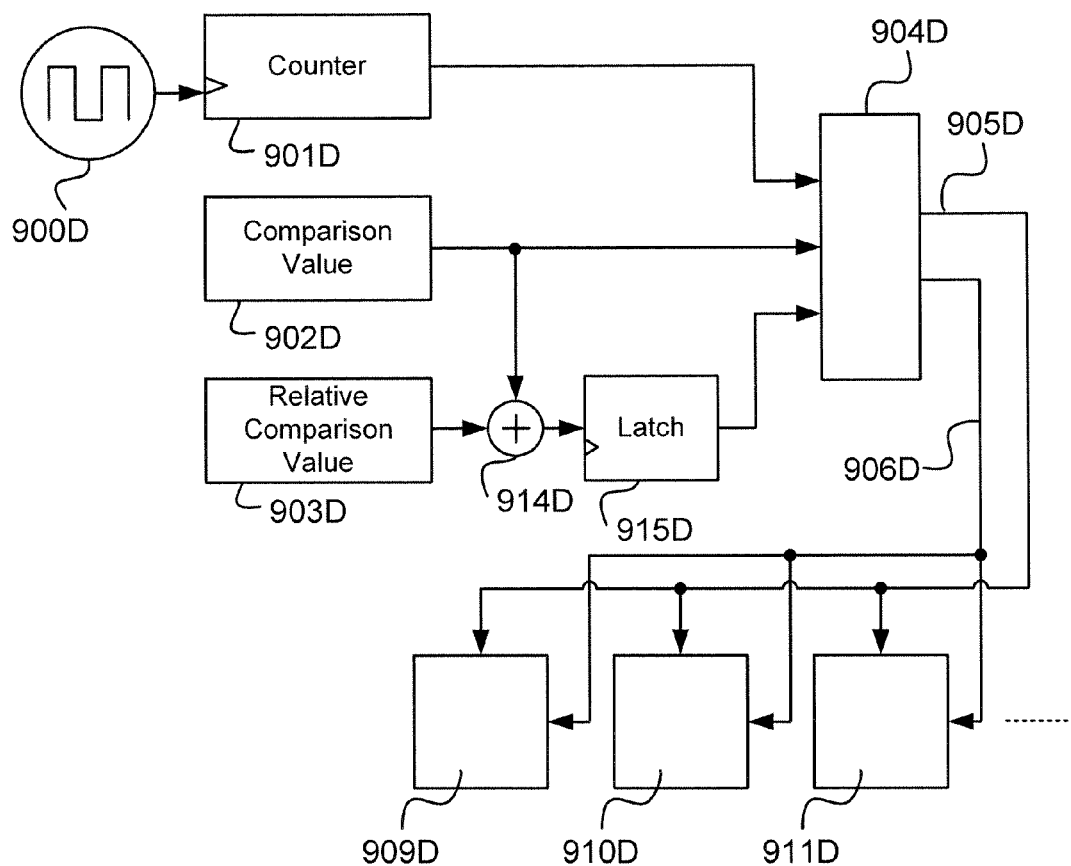
FIG. 9D is a block diagram illustrating an embodiment of a device for triggering events in a power-cycled system on a flexible time schedule wherein one comparison value is relative to the first comparison value.

FIG. 9D shows the block diagram of another embodiment of the device in FIG. 9A. In FIG. 9D, register 903D is loaded with a comparison value that is relative to the first comparison value in 902D. When register 903D is loaded, the register's value is added to the value stored in register 902D by adder 914D and the result is stored into latch 915D. When counter 901D is greater than or equal to the value in register 902D, comparison block 904D will assert the request signal 905D. When counter 901D is greater than or equal to the value in latch 915D, comparison block 904D will assert the power change signal 906D.

Figure 9E:
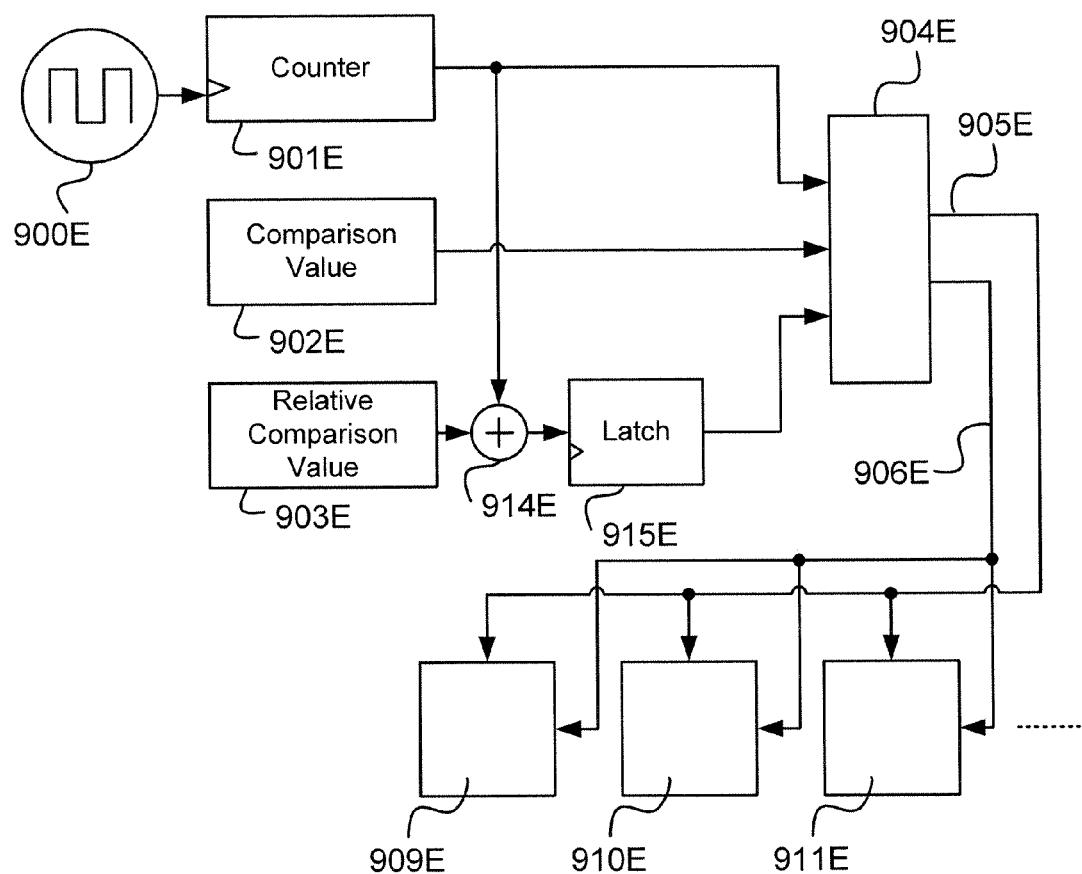
FIG. 9E is a block diagram illustrating an embodiment of a device for triggering events in a power-cycled system on a flexible time schedule wherein one comparison value is relative to the time counter.

FIG. 9E shows the block diagram of another embodiment of the device in FIG. 9A. Register 903E contains a relative comparison value that is relative to the value of the counter 901E at the time that 903E is loaded. When 903E is loaded, the value stored in the register is added to that in counter 901B by adder 914E and the result is stored into latch 915E and subsequently used by the comparison block 904E.

Figure 10A:
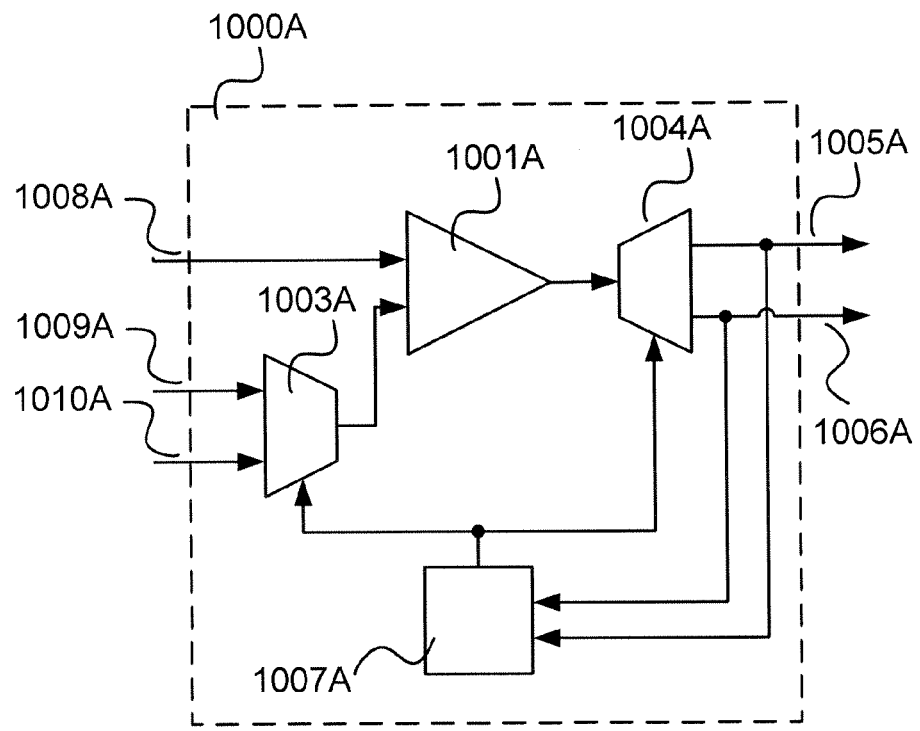
FIG. 10A is a block diagram illustrating an embodiment of a comparator block.

FIG. 10A shows the block diagram of an embodiment 1000A of a comparator block such as comparator blocks 904A, 904B, 904C, 904D, or 904E. Signal 1009A can correspond to the output signal of a register (e.g., one of registers/latches 902A, 913B, 913C, 902D, or 902E) storing a first comparison value or a latched value incorporating the first comparison value. Signal 101 OA can correspond to the output signal of a register (e.g., a corresponding one of registers/latches 903A, 903B, 915C, 915D, or 915E) storing a second comparison value or a latched value incorporating the second comparison value. Signal 1008A can correspond to the value output from a counter such as counter 901A, 901B, 901C, 901D, or 901E. A first multiplexer 1003A selects one of multiplexer input signals 1009A or signal 1010A to be passed as a multiplexer output signal to the comparator 1001A. Comparator 1001A receives signal 1008A at a first input and the multiplexer output signal at a second input, and produces a comparator output signal. Demultiplexer 1004A receives the comparator output signal at an input, and determines whether the comparator output signal should be coupled to and drive signal line 1005A or 1006A. Logic block 1007A controls the multiplexer 1003A selection and the demultiplexer 1004A selection based upon the output signals 1005A and 1006A.

Initially, multiplexer 1003A selects signal 1009A and demultiplexer 1004A connects the comparator output signal to signal line 1005A. Comparator 1001A thus compares the counter value represented in signal 1008A to the value of signal 1009A, and when equality is reached the signal 1005A becomes asserted. Upon detecting that signal 1005A has become asserted, logic block 1007A switches multiplexer 1003A to select signal 1010A and switches demultiplexer 1004A to connect the comparator output signal to signal line 1006A. Comparator 1001A then compares the counter value represented in signal 1008A to the value of signal 1010A, and when equality is reached the signal 1006A becomes asserted. Upon detecting that signal 1006A has become asserted, logic block 1007A switches multiplexer 1003A back to selecting signal 1009A and switches demultiplexer 1004A back to connecting the comparator output signal to signal line 1005A. This scheme only requires one multi-bit comparator 1001A to perform two separate comparisons. Signal 1005A corresponds to signals 905A, 905B, 905C, 905D, or 905E of FIGS. 9A-9E, and signal 1006A corresponds to signals 906A, 906B, 906C, 906D, or 906E. In some embodiments, logic block 1007A can control multiplexer 1003A to select signal 1009A and control demultiplexer 1004A to connect the comparator output signal to signal line 1005A whenever a signal on the signal line 1005A is acted upon, rather than waiting until the signal 1006A has been asserted. The power state change signal 1006A will thus not be asserted if the request 1005A has already been acted upon.

Figure 10B:
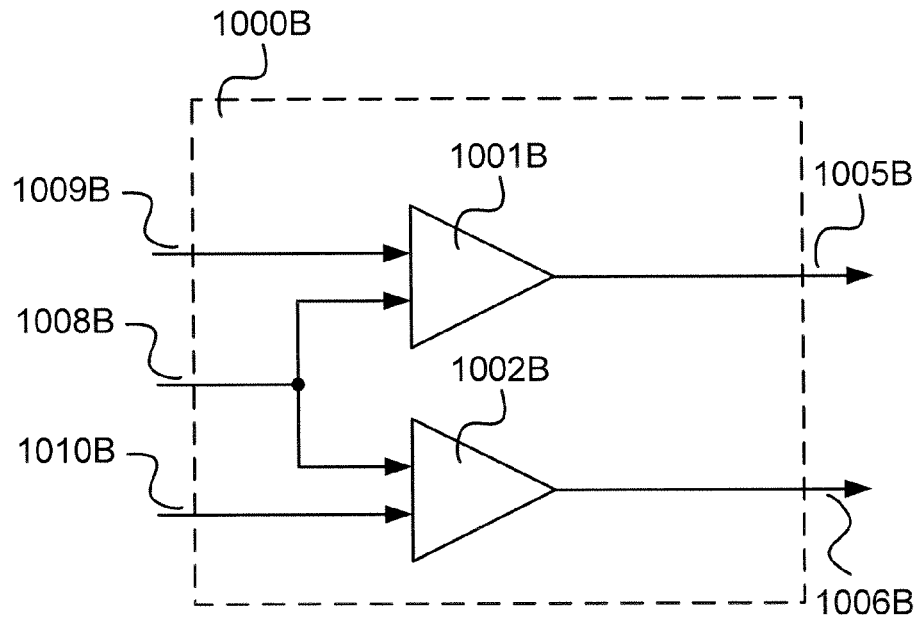
FIG. 10B is a block diagram illustrating an embodiment of a comparator block.

FIG. 10B shows a block diagram of another embodiment of a comparator block such as comparator blocks 904A, 904B, 904C, 904D, or 904E. Signal 1009B can correspond to the first comparison value, and signal 1010B can correspond to the second comparison value. Signal 1008B can correspond to the value output from the counter 901A, 901B, 901C, 901D, or 901E. When signal 1009B reaches a value that causes the comparison with signal 1008B performed by comparator 1001B to be true, the output signal 1005B will be asserted. When the counter value 1008B subsequently reaches a value that causes the comparison with 1010B performed by comparator 1002B to be true, the output signal 1006B will be asserted. Signal 1005B can correspond to signals 905A, 905B, 905C, 905D, or 905E. Signal 1006B can correspond to signals 906A, 906B, 906C, 906D, or 905E. In some embodiments, signal 1006B will not be asserted if the request 1005B has already been acted upon.

Although the foregoing embodiments have been described in some detail for purposes of clarity of understanding, the invention is not limited to the details provided. There are many alternative ways of implementing the invention. The disclosed embodiments are illustrative and not restrictive.

What is disclosed is:

1. A device for maintaining timing information comprising:
    a first oscillator having a first frequency and an output;
    a first counter having an input coupled to the first oscillator output, the first counter producing a count signal incremented at the first frequency;
    an accumulator having an input coupled to the first oscillator output and outputting an accumulation signal, wherein the accumulator maintains timing information with a resolution higher than that of the accumulation signal;
    a first comparator coupled to the first counter and the accumulator, and configured for outputting a first comparator output signal based on a comparison between the count signal and the accumulation signal; and
    a second oscillator having a second frequency higher than the first frequency,
    wherein the comparator output signal is operative to enable a second counter producing a count signal incremented at the second frequency so as to trigger an event with a resolution of the second frequency.

2. The device as in claim 1, wherein the second oscillator can be turned off to reduce the power consumption.

3. The device as in claim 1, wherein the timing information maintained by the accumulator is incremented when the first comparator output signal is asserted.

4. The device as in claim 1, wherein the second oscillator consumes more power when operating than the first oscillator when operating.

5. The device as in claim 1,
    wherein the second counter is coupled to an output of the second oscillator, has an enable input controlled by the first comparator output signal, and produces a second count signal; and
    wherein the device further comprises a second comparator coupled to the second counter and the accumulator, and configured for outputting a second comparator output signal based on a comparison between the second count signal and the accumulation signal.

6. The device as in claim 5, wherein the accumulation signal received by the second comparator includes least significant bits of the timing information maintained by the accumulator.

7. The device as in claim 1, wherein the accumulation signal received by the comparator does not include least significant bits of the timing information maintained by the accumulator.

8. The device as in claim 1, further comprising:
a register for storing an update value and coupled to the accumulator,
wherein the timing information maintained by the accumulator is incremented by the update value stored in the register.

9. The device as in claim 8, wherein the timing information maintained by the accumulator can be adjusted to correct for timing errors with respect to another device.

10. The device as in claim 1, further comprising:
a third counter having an input coupled to the output of the first comparator; and
a second comparator coupled to an output of the third counter, and outputting a comparator output signal when the third counter equals or exceeds a specified value.

11. The device as in claim 10, further comprising:
a memory storing a sequence of program instructions;
a microsequencer for executing the sequence of program instructions retrieved from the memory;
wherein the operation of the microsequencer is triggered by the output of the second comparator.

12. The device as in claim 1, further comprising:
a third counter updated on a change of the output of the first oscillator and reset to an initial value each time a defined period has elapsed.

13. The device as in claim 12, wherein the third counter is reset when the first comparator output signal is asserted.

14. The device as in claim 12, further comprising:
a second comparator coupled to an output of the fourth third counter and configured to generate a second comparator output signal a specified number of periods of the first oscillator after the first comparator output signal becomes asserted.

15. The device as in claim 1, further comprising:
a second comparator that generates a second comparator output signal that is asserted a specified number of periods of the first oscillator before the first comparator output signal is asserted.

16. The device as in claim 15, further comprising:
a third counter having an input coupled to the output of the first comparator;
a third comparator coupled to an output of the third counter, and outputting a comparator output signal when the third counter equals or exceeds a specified value;
a memory storing a sequence of program instructions;
a microsequencer for executing the sequence of program instructions retrieved from the memory;
wherein the operation of the microsequencer is triggered by the outputs of the third comparator and of the second comparator.

* * * * *